(12) United States Patent
Yamamuro et al.

(10) Patent No.: US 8,546,797 B2
(45) Date of Patent: Oct. 1, 2013

(54) ZINC OXIDE BASED COMPOUND SEMICONDUCTOR DEVICE

(75) Inventors: Tomofumi Yamamuro, Kawasaki (JP); Hiroyuki Kato, Yokohama (JP); Akio Ogawa, Yamato (JP)

(73) Assignee: Stanley Electric Co., Ltd., Tokyo (JP)

( * ) Notice: Subject to any disclaimer, the term of this patent is extended or adjusted under 35 U.S.C. 154(b) by 230 days.

(21) Appl. No.: 12/907,127

(22) Filed: Oct. 19, 2010

(65) Prior Publication Data

US 2011/0089418 A1    Apr. 21, 2011

(30) Foreign Application Priority Data

Oct. 20, 2009  (JP) ................. 2009-241081
Oct. 30, 2009  (JP) ................. 2009-250540

(51) Int. Cl.
*H01L 29/12* (2006.01)
*H01L 21/00* (2006.01)

(52) U.S. Cl.
USPC .............. 257/43; 257/E29.068; 257/E21.459

(58) Field of Classification Search
None
See application file for complete search history.

(56) References Cited

U.S. PATENT DOCUMENTS

| | | | |
|---|---|---|---|
| 6,569,548 B2 | 5/2003 | Yamamoto et al. | |
| 7,449,720 B2 | 11/2008 | Suzuki et al. | |
| 2001/0017257 A1* | 8/2001 | Choi et al. | 204/192.22 |
| 2006/0049425 A1* | 3/2006 | Nause et al. | 257/103 |
| 2007/0072439 A1 | 3/2007 | Akimoto et al. | |
| 2007/0248515 A1* | 10/2007 | Tompa et al. | 423/179 |
| 2011/0114938 A1 | 5/2011 | Nakahara et al. | |

FOREIGN PATENT DOCUMENTS

| | | |
|---|---|---|
| JP | 09-260776 A | 10/1997 |
| JP | 3040373 B2 | 10/1999 |
| JP | 2002-050229 A | 2/2002 |
| JP | 2002-261321 A | 9/2002 |
| JP | 2004-095649 A | 3/2004 |
| JP | 2004-221352 A | 8/2004 |
| JP | 2006-019695 A | 1/2006 |
| JP | 2007-123861 A | 5/2007 |
| JP | 2008-283132 A | 11/2008 |
| JP | 2009-200239 A | 9/2009 |
| JP | 2009-212139 A | 9/2009 |
| JP | 2009-266938 A | 11/2009 |

OTHER PUBLICATIONS

H. Kato et al; The 120$^{th}$ Division of Crystals Science and Tech Meeting; Japan Society of Applied Physics, Catalog No. AP 042214; pp. 27-34; Apr. 23, 2004.
Japanese Office Action dated Jun. 25, 2013 (and English translation thereof) in counterpart Japanese Application No. 2009-250540.
Japanese Office Action dated Jun. 25, 2013 (and English translation thereof) in counterpart Japanese Application No. 2009-241081.

* cited by examiner

*Primary Examiner* — Michael Lebentritt
*Assistant Examiner* — Kevin Quinto
(74) *Attorney, Agent, or Firm* — Holtz, Holtz, Goodman & Chick, PC

(57) ABSTRACT

In a ZnO based compound semiconductor device, nitrogen (N) doped (Mg)ZnO:N layer is inserted as a diffusion barrier layer 9 between a ZnO based n-type layer 3 to which n-type dopants are doped and an active layer 4 or a p-type layer 5. The diffusion barrier layer 9 prevents diffusion of the n-type dopants to the active layer 4 or the p-type layer 5. Crystalline quality of the active layer 4 of the ZnO based compound semiconductor device is not deteriorated by the diffusion of the n-type dopants.

10 Claims, 10 Drawing Sheets

US 8,546,797 B2

ZINC OXIDE BASED COMPOUND SEMICONDUCTOR DEVICE

This application is based on Japanese Patent Application 2009-241081, filed on Oct. 20, 2009 and Japanese Patent Application 2009-250540, filed on Oct. 30, 2009, the entire contents of which are incorporated herein by reference.

BACKGROUND OF THE INVENTION

A) Field of the Invention

This invention relates to a zinc oxide based compound semiconductor device and more specifically relates to a zinc oxide based compound semiconductor light emitting device.

B) Description of the Related Art

Zinc Oxide (ZnO) is a direct band gap semiconductor with band gap energy of 3.37 eV at a room temperature and exciton binding energy of 60 meV which is relatively larger than other semiconductors. Moreover, it is characterized in that source material is cheap and harmless to a human body and environment, and so it is expected to realize an ecological light emitting device which is highly efficient and low power consuming.

A p-type layer and an n-type layer are necessary for a light emitting device such as a light emitting diode (LED), etc. A dopant for fabricating an n-type layer in a ZnO based compound semiconductor may be group III elements substituting Zn sites and group VII atoms substituted oxygen (O) sites, and especially a large number of n-type conductivity control have been reported by using group III elements such as gallium (Ga), aluminum (Al), Indium (In), etc.

For example, Japanese Patent No. 3040373 suggests a method for fabricating ZnO based transparent conductive films ZnO:Al, ZnO:Ga by doping the group III elements. 120th Division of Crystals Science and Technology, Japan Society of Applied Physics (2004), p. 27-34 reported that Ga concentration and carrier concentration in a single crystalline ZnO film could be sufficiently controlled in a range of $10^{17}$ to $10^{20}$ cm$^{-3}$.

When fabricating a light emitting device such as an LED, etc., a device performance will be significantly lowered if dopants diffuse to non-desired layers. In case of a GaAs type semiconductor light emitting device, diffusion of p-type dopants to an active layer has been a problem, and so, for example, Japanese Laid-open Patent H09-260776 discloses a method for restraining the diffusion of p-type dopants by forming an n-type diffusion stopper layer between a p-type cladding layer and the active layer. Moreover, Japanese Laid-open Patent 2006-19695 discloses a method for restraining the diffusion of p-type dopants by forming a p-type layer consisting of at least two layers to which different dopants are doped. In case of the GaAs type semiconductor light emitting device, some methods for restraining the diffusion of p-type dopants are disclosed as in the above.

On the other hand, concerning to a ZnO based compound semiconductor, diffusion of dopants has been hardly reported, but the inventors of the present invention have found the diffusion of Ga as an n-type dopant in a semiconductor device as a problem to be solved.

FIG. 18 is a cross sectional view showing one example of a structure of a ZnO based LED device manufactured by a conventional method.

A normal LED has an n-type semiconductor layer, an active layer and a p-type semiconductor layer in a device, and Ga atoms are doped as dopants to the n-type semiconductor layer of the ZnO based LED.

The inventors of the present invention have actually manufactured the ZnO based LED device shown in FIG. 18 as a first comparative example by using the conventional manufacturing method.

First, on a cleansed n-type +c ZnO substrate 1 an undoped ZnO buffer layer 2 was formed. The buffer layer 2 was grown to have a thickness of 30 nm at 300 degrees Celsius. Next, annealing was performed to improve quality of the buffer layer 2. The annealing was performed at 900 degrees Celsius for 20 minutes.

After that, on a surface of the buffer layer 2, an n-type semiconductor layer 3 was formed at a growth temperature of 900 degrees Celsius. The n-type semiconductor layer 3 was Ga-doped $Mg_{0.2}Zn_{0.8}O$, and the concentration of Ga was about $2 \times 10^{18}$ cm$^{-3}$.

Thereafter, an undoped ZnO active layer 4 was formed on a surface of the n-type semiconductor layer 3 at a growth temperature of 900 degrees Celsius. On a surface of the active layer 4, a p-type semiconductor layer (N-doped $Mg_{0.2}Zn_{0.8}O$) 5 was formed at a growth temperature of 650 degrees Celsius.

Following the above described layer formation (film formation) processes, electrodes were formed. An n-type electrode (e.g., a lamination of a titan layer with a thickness of 2-10 nm and an aluminum layer with a thickness of 300-500 nm formed on the titan layer) 8 was formed on a surface of the substrate 1, a p-type transparent electrode (e.g., a lamination of a nickel layer which a thickness of 0.5-5 nm and a gold layer with a thickness of 1-20 nm formed on the nickel layer) 6 was formed on a surface of the p-type semiconductor layer, and a bonding-pad electrode (e.g., a lamination of a nickel layer with a thickness of 100 nm and a gold layer with a thickness of 1000 nm) 7 was formed on the p-type transparent electrode 6. A lithography technique using a resist film, etc. was used for forming the electrodes.

Finally an electrode alloying process was performed, for example, in oxidizing gas atmosphere at 300-800 degrees Celsius for about 30 seconds to 10 minutes. As described in the above, the ZnO based compound semiconductor light emitting device (ZnO based LED) was manufactured.

FIG. 19 is a graph showing depth profiles of N concentration and Ga concentration in the ZnO based LED manufactured by the conventional method as the LED shown in FIG. 18. This graph is based on a secondary ion-microprobe mass spectrometer (SIMS) measurement.

It is understood from the graph that the Ga atoms doped only to the n-type semiconductor layer 3 diffuse into the active layer 4 and a part of the p-type semiconductor layer 5. In that case, crystalline quality of the active layer 4 is lowered and defects functioning as nonradiative-recombination-centers are introduced and internal quantum efficiency is lowered. In the p-type layer 5, n-type carries are formed by the introduction of the defects by the decrease in crystalline quality and by the diffusion of the Ga atoms, and the formation of the n-type carries causes decrease in concentration of p-type carries and formation of n-type and gives bad effect on a manufacturing of a high power semiconductor light emitting device with high reliability. It can be considered that the diffusion of Ga atoms from the n-type layer progresses simultaneously with the growth of the active layer 4 and the p-type layer 5 while the substrate is kept at a high temperature.

FIG. 20 is a graph showing one example of current-voltage characteristics of the ZnO based LED whose SIMS measurement is shown in FIG. 19.

The graph shows current on a vertical axis and voltage on a horizontal axis. The unit of the vertical axis is 2 mA and the unit of the horizontal axis is 2V. In case of fabricating a p-n junction with ZnO based material, threshold voltage in the current-voltage characteristics should be about 3V; however, the ZnO based LED in FIG. 20 has the threshold voltage of about 1V. It shows that characteristic of the device is Schottky. This is because the device performance of the LED is significantly lowered by the diffusion of the Ga atoms as the dopants from the n-type semiconductor layer 3 to the p-type semiconductor layer 5. Therefore, no light emission can be observed from the ZnO based LED manufactured by the conventional method.

The diffusion of the Ga atoms can be restrained by keeping a substrate temperature (growth temperature) at least under 500 degrees Celsius when the active layer and the p-type semiconductor layer are formed on the n-type ZnO based semiconductor layer. However, if the growth temperature is too low, surfaces of the grown films will be very rough. In the MBE growth, if a distance which atoms (e.g., Zn or O) supplied to the surface of the substrate move on the surface of the substrate by migration at the time of the growth is not sufficient, a very rough three dimensionally grown film will be formed. The moving distance by the migration becomes short when the temperature is low and so the three-dimensionally grown film is formed.

Therefore, the substrate temperature (under about 500 degrees Celsius) wherein the Ga diffusion does not occur is too low and a three dimensionally grown film is formed. It is not preferable because the rough three-dimensionally grown film has dislocations and many spot defects and the dislocations and the defects lower the internal quantum efficiency and life time of the light emitting device.

For example, Japanese Laid-open Patent No. 2002-261321 discloses a light emitting device made of GaAs based compound semiconductor and having a lamination of an n-type cladding layer, an active layer and a p-type cladding layer, wherein a diffusion restraining layer mainly made of GaAs based compound semiconductor containing carbon atoms is formed between the p-type cladding layer and the active layer. The diffusion restraining layer restrains diffusion of Zn, Mg, Cd, BE, etc. used as dopants to the p-type cladding layer into the active layer.

Formation of such diffusion restraining layer or a diffusion barrier layer is effective to diffusion of atoms; however, high voltage is necessary to be applied to a light emitting device to desired electroluminescence intensity because those films are inserted as an additional layer which increases a thickness of the device.

SUMMARY OF THE INVENTION

It is an object of the present invention to prevent decrease in crystalline quality of an active layer of a ZnO based compound semiconductor caused by diffusion of n-type dopants.

It is another object of the present invention to prevent deterioration of conductivity of a p-type semiconductor layer of a ZnO based compound semiconductor caused by diffusion of n-type dopants.

According to one aspect of the present invention, there is provide a ZnO based compound semiconductor device, comprising: an n-type semiconductor layer to which group III elements and nitrogen atoms are doped; a p-type semiconductor layer formed above the n-type semiconductor layer; an active layer formed between the n-type semiconductor layer and the p-type semiconductor layer.

According to another aspect of the present invention, there is provided a method for manufacturing a ZnO based semiconductor device, comprising the steps of: preparing a substrate; forming an n-type semiconductor layer, to which group III elements and nitrogen (N) atoms are doped, on the substrate by using a molecule beam epitaxy (MBE) method; forming an active layer on the n-type semiconductor layer by using the MBE method; and forming the p-type semiconductor layer on the active layer by using the MBE method.

According to the present invention, decrease in crystalline quality of an active layer of a ZnO based compound semiconductor caused by diffusion of n-type dopants can be prevented.

Moreover, according to the present invention, deterioration of conductivity of a p-type semiconductor layer of a ZnO based compound semiconductor caused by diffusion of n-type dopants can be prevented.

DETAILED DESCRIPTION OF THE PREFERRED EMBODIMENTS

Figure 1:
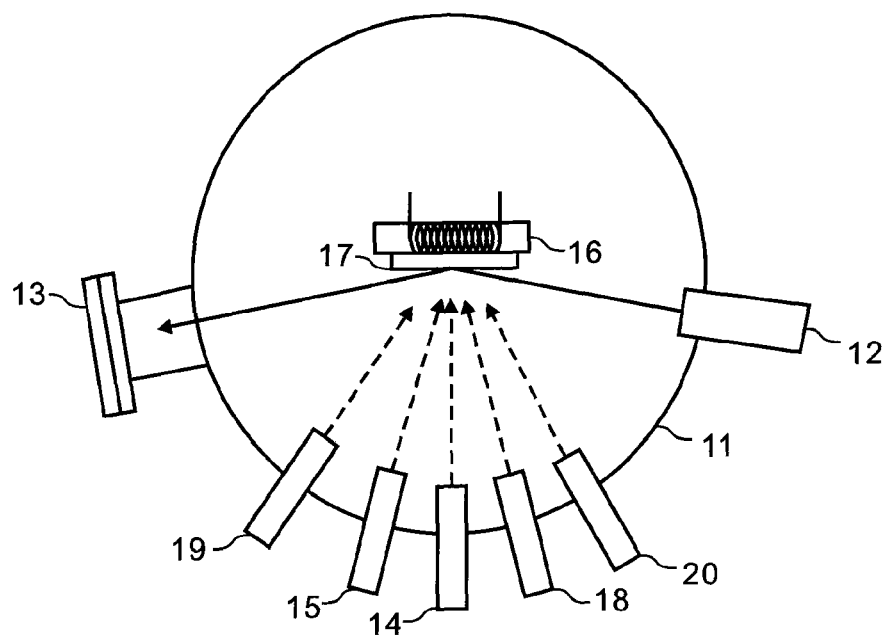
FIG. 1 is a schematic view of an apparatus for manufacturing a ZnO based compound semiconductor.

FIG. 1 is a schematic view of an apparatus for manufacturing a ZnO based compound semiconductor.

A ZnO based compound semiconductor using ZnO and MgZnO will be described below.

As a method for manufacturing a ZnO based compound semiconductor, for example, there is known a molecule beam epitaxy (MBE) method which grows ZnO on a substrate by simultaneously irradiating an oxygen radical beam generated by an electrodeless discharge tube by applying high frequency waves of 13.56 MHz and a Zinc beam supplied from a Knudsen cell (K cell) to the substrate heated at a growth temperature.

A ZnO substrate is usually used for the growth substrate. There is know a method for epitaxially growing a ZnO based compound semiconductor layer on the ZnO substrate, wherein a ZnO buffer layer is formed on the ZnO substrate at a low temperature and an annealing process is performed at a high temperature, and thereafter the ZnO layer is grown at a predetermined temperature. Moreover, it is known that there is a method wherein the ZnO layer is directly grown on the ZnO substrate without a buffer layer. It is preferable to set a growth temperature (a temperature of substrate at the time of growth) of a ZnO based compound semiconductor layer to high, e.g., at least 500 degrees Celsius and preferably no less than 700 degrees Celsius, in terms of improving crystalline quality. If the substrate temperature becomes less than 500 degrees Celsius, planarity and crystalline quality will be drastically deteriorated.

A substrate heater 16 is placed inside an ultrahigh vacuum chamber 11, and a substrate 17 is held by the substrate heater 16. The ultrahigh vacuum chamber 11 is equipped with a zinc (Zn) source gun 14, an oxygen (O) radical source gun 15, a magnesium (Mg) source gun 18, a nitrogen (N) radical source gun 19 and a gallium (Ga) source gun 20. The zinc source gun 14, the magnesium source gun 18 and the gallium source gun 20 include Knudsen cell containing solid sources of Zn, Mg and Ga and irradiate a zinc beam, magnesium beam and gallium beam respectively.

Each of the oxygen radical source gun 15 and the nitrogen radical source gun 19 includes an electrodeless discharge tube using high frequency waves (e.g., 13.56 MHz). The oxygen radical source gun 15 generates oxygen radicals by introducing oxygen gas into the electrodeless discharge tube and irradiates an oxygen radical beam, and the nitrogen radical source gun 19 generates nitrogen radicals by introducing nitrogen gas into the electrodeless discharge tube and irradiates a nitrogen radical beam. By supplying desired beams onto the substrate 17 at a desired timing, a ZnO based compound semiconductor layer with a desired composition can be grown on the substrate 17.

The magnesium source gun 18, the nitrogen source gun 19 and the gallium source gun 20 are equipped according to the necessity at the time of manufacturing a light emitting diode (LED). An $NH_3$ source gun may be used instead of the nitrogen source gun 19 to directly supply $NH_3$ gas onto a surface of the substrate 17.

Moreover, the ultrahigh vacuum chamber 11 is equipped with a gun 12 for reflection high-energy electron diffraction (RHEED) and a display 13 displaying a RHEED pattern obtained electron diffraction. Crystalline quality of the ZnO based compound semiconductor layer formed on the substrate 17 can be characterized from the RHEED pattern. When the ZnO based compound semiconductor layer is a single crystalline layer having a planarized (two dimensionally grown) surface, the RHEED pattern becomes a streak pattern. When the ZnO based compound semiconductor layer is a single crystalline layer having a rough (three dimensionally grown) surface, the RHEED pattern becomes a spot pattern. Moreover, when the ZnO based compound semiconductor layer is a polycrystalline layer, the RHEED pattern becomes a ring pattern.

A vacuum pump evacuates air from the ultrahigh vacuum chamber 11. In this specification a condition under pressure not higher than $1 \times 10^{-7}$ Torr is called ultrahigh vacuum.

When growing an n-type layer in a ZnO based compound semiconductor device, an oxygen radical beam, a zinc beam and a gallium beam are simultaneously irradiated onto a substrate 17 which is heated at the growth temperature.

Moreover, a desired layer with a desired composition can be formed in a ZnO based compound semiconductor light emitting device, for example, by using the nitrogen radical beam gun 19 which generates nitrogen radicals from nitrogen gas when growing a hole carrier injection layer (p-type layer), or by using the magnesium gun 18 irradiating a magnesium (Mg) beam when growing a cladding layer.

For a substrate used for manufacturing a ZnO based compound semiconductor, there are a zinc oxide substrate (ZnO), a sapphire substrate ($Al_2O_3$), a silicon carbide substrate (SiC), a gallium nitride substrate (GaN), a hexagonal $Mg_xZn_{1-x}O$ substrate ($0 < x \leq 0.5$), a cubic $Mg_xZn_{1-x}O$ substrate ($0.5 < x \leq 1$), a Si substrate, etc. In order to obtain a zinc oxide (ZnO) layer of good crystalline quality, it is preferable to use a substrate with small lattice mismatch and more preferable to use a zinc oxide (ZnO) substrate. Moreover, in case of manufacturing a light emitting device, it is preferable to use a $Mg_xZn_{1-x}O$ substrate ($0 < x \leq 1$) having a wide band gap comparing to ZnO in order to maintain light extraction efficiency from a device by preventing a substrate from absorbing light emitted from an active layer.

A ZnO based compound semiconductor layer can be grown on a substrate by using various planes such as +c plane, −c plane, a plane, m plane, etc. Moreover, for example, various +c plane substrates with off-angle in an m-direction and in an a-direction can be used. Furthermore, a template forming MgZnO, ZnO, GaN films with a thickness of no less than 1 μm on a substrate can be used.

Figure 2:
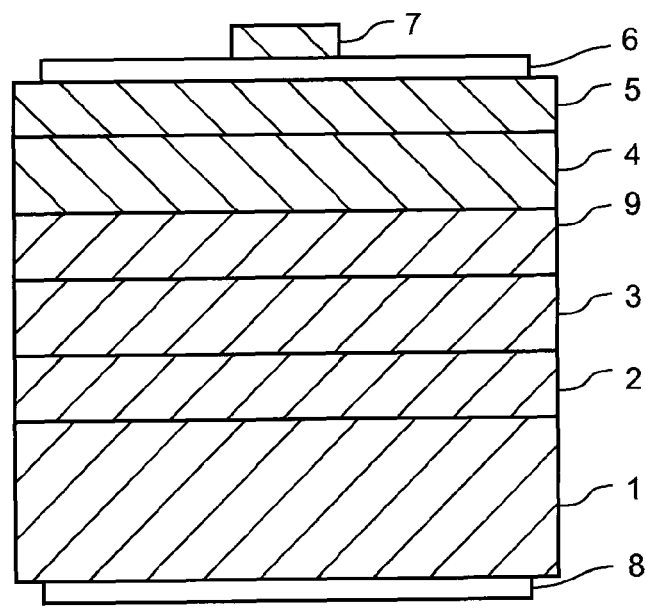
FIG. 2 is a schematic cross sectional view for explaining a method for manufacturing a ZnO based compound semiconductor device (ZnO based LED) and its structure according to a first embodiment of the present invention.

FIG. 2 is a schematic cross sectional view for explaining a method for manufacturing a ZnO based compound semiconductor device (ZnO based LED) and its structure according to a first embodiment of the present invention.

A device structure and a ZnO based compound semiconductor film according to the first embodiment of the present invention is, for example, manufactured by the molecule beam epitaxy (MBE) method explained with reference to FIG. 1. Moreover, they can be manufactured also by a well-known epitaxial growing method such as a pulsed laser deposition (PLD) method, a metal organic vapor phase epitaxy (MOVPE) method.

First, a buffer layer 2 is formed on a cleaned +c ZnO substrate 1. A thickness of the buffer layer 2 is preferably about 100 to 300 Å and is grown at 200 to 400 degrees Celsius. Thereafter, an annealing process is performed to improve a quality of the buffer layer 2 at an annealing temperature of 500 to 1000 degrees Celsius for 3 to 30 minutes.

Next, on a surface of the buffer layer 2, an n-type semiconductor layer 3 to which gallium or aluminum is doped is formed at a growth temperature of 800 to 1000 degrees Celsius with a thickness of 100 to 10000 Å and with dopant concentration of not less than $5 \times 10^{17}$ cm$^{-3}$.

A diffusion barrier layer 9 for preventing diffusion of n-type dopants is formed on a surface of the n-type semiconductor layer 3. The diffusion barrier layer 9 will be explained later in detail. An undoped $Mg_yZn_{1-y}O$ ($0 \leq y \leq 0.6$) active layer 4 is formed on a surface of the diffusion barrier layer 9 at a growth temperature of 500 degrees Celsius to 1000 degrees Celsius. The active layer 4 can be a single layer or a quantum well structure using MgZnO and ZnO.

The active layer 4 has to have a remarkable crystalline quality. When the growth temperature is lower than 500 degrees Celsius, high quality $Mg_yZn_{1-y}O$ ($0 \leq y < 1$) with a good crystalline quality cannot be grown. On the other hand, when the growth temperature is higher than 1000 degrees Celsius, Zn atoms will be re-evaporated from the substrate and it significantly lowers a growth rate.

Then a p-type semiconductor layer ($Mg_zZn_{1-z}O$ ($0 \leq z \leq 0.6$)) 5 to which nitrogen (N) is doped is formed on a surface of the active layer 4 at a growth temperature of 300 to 800 degrees Celsius with a thickness of 50 to 2000 Å and with nitrogen (N) concentration of not less than $1 \times 10^{18}$ cm$^{-3}$.

The concentration of nitrogen (N) in the p-type semiconductor layer 5 is necessary to be at least not less than $1 \times 10^{16}$ cm$^{-3}$ as a hole carrier concentration for manufacturing a light emitting device such as an LED, etc. Effective hole carriers cannot be obtained unless not less than $1 \times 10^{18}$ cm$^{-3}$ of nitrogen (N) is doped because nitrogen atoms are low in activation rate when doped into ZnO and ZnMgO as acceptors. Moreover, when the concentration of nitrogen (N) becomes not less than $5 \times 10^{20}$ cm$^{-3}$, many defects will be found in the p-type ZnMgO layer and the p-type ZnO film, which may cause leak when applying the current to a device. Therefore, the concentration of nitrogen (N) is preferably in a range of $1 \times 10^{18}$ cm$^{-3}$ to $5 \times 10^{20}$ cm$^{-3}$, and more preferably in a range of $1 \times 10^{19}$ cm$^{-3}$ to $3 \times 10^{20}$ cm$^{-3}$.

The p-type dopants doped into the p-type semiconductor layer 5 may be phosphorus (P) or arsenic (As), which are group V elements, instead of using nitrogen (N). Moreover, group I elements such as lithium (Li), sodium (Na), copper (Cu) and silver (Ag) can be used as the p-type dopants instead of the group V elements. Furthermore, a combination of the above atoms, for example N and P, can be co-doped.

Nitrogen atoms substitute a part of O-sites and become acceptors, and ionic radius of nitrogen is close to that of oxygen comparing to other group V elements and so stable substitution takes place. Various nitrogen sources such as $N_2$, $N_2O$, NO, $N_2+O_2$, $NH_3$, etc. containing nitrogen atoms can be used for doping nitrogen.

Following the above described layer formation (film formation) processes, electrodes are formed. An n-type electrode (e.g., a lamination of a titan layer with a thickness of 20 to 100 Å and an aluminum layer with a thickness of 3000 to 5000 Å formed on the titan layer) 8 is formed on a surface of the substrate 1, a p-type transparent electrode (e.g., a lamination of a nickel layer with a thickness of 5 to 50 Å and a gold layer with a thickness of 10 to 200 Å formed on a surface of the nickel layer) 6 is formed on a surface of the p-type semiconductor layer 5, and a pad electrode for bonding (e.g., a lamination of a nickel layer with a thickness of 1000 Å and a gold layer with a thickness of 10000 Å) 7 is formed on the p-type transparent electrode 6. A lithography technique using a resist film, etc. is used for the processes for forming the electrodes.

Thereafter, a process for alloying the electrodes is performed in oxidizing gas atmosphere at 300 to 800 degrees Celsius for about 30 seconds to 10 minutes. As described in the above, the ZnO based compound semiconductor light emitting device (ZnO based LED) is manufactured.

Although in the above described embodiment, the light emitting device is manufactured by using the +c plane ZnO substrate (n-type conductivity), other type of substrate can be used. In case of using other type of substrate, a part of the manufacturing processes may be different from the above-described processes. For example, when an insulating substrate such as a sapphire ($Al_2O_3$) substrate is used, an electrode cannot be formed on the substrate. Therefore, a process for exposing a surface of the n-type semiconductor layer 3 by using a dry-etching method, etc. to form the n-type electrode 8 thereon will be necessary.

In case of using a ZnO substrate, etc. to which group III elements such as Ga, Al, etc. are doped to manufacture a semiconductor light emitting device, the substrate itself functions as an electron injection layer; therefore, the n-type semiconductor layer 3 can be omitted. Even in that case, by using the diffusion barrier layer 9 according to the embodiment of the present invention, diffusion of the dopants from the substrate 1 can be prevented or at least restrained. Moreover, if the diffusion barrier layer 9 is inserted between the n-type semiconductor layer 3 to which n-type dopants are doped or the substrate 1 and the active layer 4, the n-type semiconductor layer 3/the substrate 1 and the diffusion barrier layer 9 are not necessarily adjoining to each other.

The inventors of the present invention have actually fabricated three types of the semiconductor light emitting devices (samples 1 to 3) by the above-described method for manufacturing a ZnO based compound semiconductor according to the first embodiment of the present invention. Below describes fabrication conditions of the samples 1 to 3.

First of all, the fabrication condition of the sample 1 will be explained. An undoped ZnO buffer layer 2 was grown on a cleaned +c ZnO substrate 1 at a growth temperature of 300 degrees Celsius with a thickness of 300 Å. Thereafter, the annealing process was performed to improve a quality of the undoped ZnO buffer layer 2 at an annealing temperature of 900 degrees Celsius for 20 minutes.

Next, on a surface of the buffer layer 2, an n-type semiconductor layer 3 was grown at a growth temperature of 950 degrees Celsius. The n-type semiconductor layer 3 was Ga-doped ZnO with Ga concentration of about $2.0 \times 10^{18}$ cm$^{-3}$.

Then an N-doped ZnO diffusion barrier layer 9 for preventing diffusion of the n-type dopants was deposited on a surface of the n-type semiconductor layer 3 with a thickness of 50 nm. The growth temperature was 900 degrees Celsius, Zn beam flux was 3.0 Å/s, an amount of $O_2$ flow was 1 sccm (RF power 250 W), and an amount of $N_2$ flow was 1 sccm (RF power 140 W).

Thereafter an undoped ZnO active layer 4 was formed on a surface of the diffusion barrier layer 9 at the growth temperature of 900 degrees Celsius. Then a nitrogen (N) doped p-type semiconductor layer (N-doped MgZnO (Mg composition 0.2)) 5 was deposited on a surface of the active layer 4 with a thickness of 50 nm. The growth temperature was 700 degrees Celsius, Zn beam flux was 1.0 Å/s, Mg beam flux was 0.2 Å/s, an amount of $O_2$ flow was 2 sccm (RF power 300 W), and an amount of $N_2$ flow was 1 sccm (RF power 120 W).

Second, the fabrication condition of the sample 2 will be explained. The buffer layer 2, the active layer 4 and the p-type semiconductor layer 5 were formed similar to the sample 1.

On a surface of the buffer layer 2, an n-type semiconductor layer 3 was grown at a growth temperature of 950 degrees Celsius. The n-type semiconductor layer 3 was Ga-doped MgZnO (Mg composition 0.2) with Ga concentration of about $2.0 \times 10^{18}$ cm$^{-3}$.

Then an N-doped MgZnO diffusion barrier layer 9 for preventing diffusion of the n-type dopants was deposited on a surface of the n-type semiconductor layer 3 with a thickness of 50 nm. The growth temperature was 950 degrees Celsius, Zn beam flux was 3.0 Å/s, Mg beam flux was 0.1 Å/s, an amount of $O_2$ flow was 1 sccm (RF power 250 W), and an amount of $N_2$ flow was 1 sccm (RF power 140 W).

Finally, the fabrication condition of the sample 3 will be explained. The buffer layer 2 and the active layer 4 were formed similar to the samples 1 and 2.

On a surface of the buffer layer 2, an n-type semiconductor layer 3 was grown at a growth temperature of 950 degrees Celsius. The n-type semiconductor layer 3 was Ga-doped MgZnO (Mg composition 0.19) with Ga concentration of about $2.0 \times 10^{18}$ cm$^{-3}$.

Then an N-doped MgZnO diffusion barrier layer 9 for preventing diffusion of the n-type dopants was deposited on a surface of the n-type semiconductor layer 3 with a thickness of 50 nm. The growth temperature was 950 degrees Celsius, Zn beam flux was 3.0 Å/s, Mg beam flux was 0.2 Å/s, an amount of $O_2$ flow was 2 sccm (RF power 300 W), and an amount of $N_2$ flow was 1 sccm (RF power 120 W).

A nitrogen (N) doped p-type semiconductor layer (N-doped MgZnO (Mg composition 0.2)) 5 was deposited on the surface of the active layer 4 with a thickness of 50 nm. The growth temperature was 650 degrees Celsius, Zn beam flux was 1.0 Å/s, Mg beam flux was 0.2 Å/s, an amount of $O_2$ flow was 2 sccm (RF power 300 W), and an amount of $N_2$ flow was 1 sccm (RF power 120 W).

For all the above-described samples 1 to 3, the electrodes were formed as explained with reference to FIG. 2 after the layer formation (film formation) processes, and the process for alloying the electrodes were performed. As described in the above, the samples 1 to 3 of the ZnO based LED were fabricated.

The diffusion barrier layers 9 fabricated as the samples 1 to 3 had n-type conductivity. Nitrogen atoms become acceptors when substituting O sites and may be taken as $N_2$ molecules. In that case, the $N_2$ molecules in ZnO function as double donors; therefore, the N-doped $Mg_wZn_{1-w}O$ (0≤w<1) shows n-type conductivity as a result. By that reason the N-doped MgZnO diffusion barrier layer 9 according to the embodiment shows n-type conductivity.

A growth condition of the diffusion barrier layers 9 will be explained. Here, the flux density of Zn is JZn, the flux density of Mg is JMg, and the flux density of O-radical is JO. Moreover, coefficients showing probabilities of sticking Zn and Mg to an oxygen termination of a MgZnO crystal (sticking coefficients of Zn and Mg) are kZn and kMg, and a coefficient showing a probability of sticking O to a zinc and a magnesium terminations of a MgZnO crystal (sticking coefficient of O) is kO. The product kZnJZn of the Zn sticking coefficient kZn multiplied by the Zn flux density JZn and the product kMgJMg of the Mg sticking coefficient kMg multiplied by the Mg flux density JMg correspond to the numbers of Zn atoms and Mg atoms stuck to a unit of area of the substrate in a unit of time. Moreover, the product kOJO of the O sticking coefficient kO multiplied by the O flux density JO correspond to the number of O atoms stuck to a unit of area of the substrate in a unit of time. A ratio of the sum of the product kZnJZn and the product kMgJMg to the product kOJO is defined to be a II/VI flux ratio which means a ratio of group II elements to group VI elements. Moreover, an amount of Zn beam flux is defined to be kZnJZn, and an amount of O radical beam flux is defined to be kOJO in the embodiments of the present invention. It is called an O-rich condition when the flux ratio is greater than 1, and it is called a Zn-rich condition when the flux ratio is smaller than 1.

"J. Crystal Growth" 265 (2004), p. 375-381 discloses ZnO grows two-dimensionally under the extreme O-rich condition with the flux ratio of 5.6 and an epitaxial film can be obtained.

It is preferable for a growth condition of the diffusion barrier layer 9 to make the II/VI flux ratio II/VI≥1 and make the growth temperature not less than 800 degrees Celsius. The reason of that preference can be considered that the N2 molecule double donors get easily to be generated by thermal energy as the growth temperature rises and the nitrogen concentration in a film increases as the II/VI flux ratio increases.

Moreover, a growth speed G of a ZnO growth film can be calculated by the following equation 1.

$$G=[(kZn \cdot JZn)-1+(kO \cdot JO)-1]-1-RZnO \qquad \text{(equation 1)}$$

RZnO represents re-evaporation of ZnO, and it can be ignored when the substrate temperature is not higher than 900 degrees Celsius. However, when the substrate temperature is over 900 degrees Celsius, RZnO will be the order of several tens nm/hr and it will affect the growth speed.

Regarding to KZnJZn, a value of JZn can be obtained from a film thickness monitor by setting the sticking coefficient KZn of Zn to 1. Moreover, regarding to kOJO, the growth speed G is calculated by actually growing a ZnO film at the substrate temperature not higher than 800 degrees Celsius in which RZnO can be ignored under the known condition of KZnJZn. A value of kOJO under the set condition of the O radical gun ($O_2$ flow, RF power, etc.) can be calculated by substituting the obtained growth speed G and KZnJZn in the equation 1.

Various nitrogen sources such as $N_2$, $N_2O$, NO, $N_2+O_2$, $NH_3$, etc. containing nitrogen atoms can be used for doping nitrogen to the diffusion barrier layer 9.

The TABLE 1 shows N concentrations, Mg compositions and diffusion depths of Ga for the fabricated samples 1 to 3.

TABLE 1

| | N concentration (cm$^{-3}$) | Mg composition: W(Mg$_w$Zn$_{1-w}$O) | Diffusion depth of Ga into the diffusion barrier layer (nm) |
|---|---|---|---|
| SAMPLE 1 | 4.20e+20 | 0 | 8 |
| SAMPLE 2 | 2.40e+20 | 0.20 | 9 |
| SAMPLE 3 | 8.40e+19 | 0.19 | 20 |

In the samples 1 to 3 fabricated by the method according to the first embodiment of the present invention, the diffusion of the n-type dopants from the n-type semiconductor layer 3 is stopped by the diffusion barrier layer 9. Doping nitrogen (N) to the diffusion barrier layer 9 was effective even if the N concentration was the order of 10 to the 19th power concentration.

Regarding to the N concentration, it can be considered that the diffusion can be effectively restrained (prevented) when the N concentration doped to the diffusion barrier layer 9 is dense. That is, it is expected that is preferable to make the N concentration not less than $1 \times 10^{20}$ cm$^{-3}$.

Figure 3:
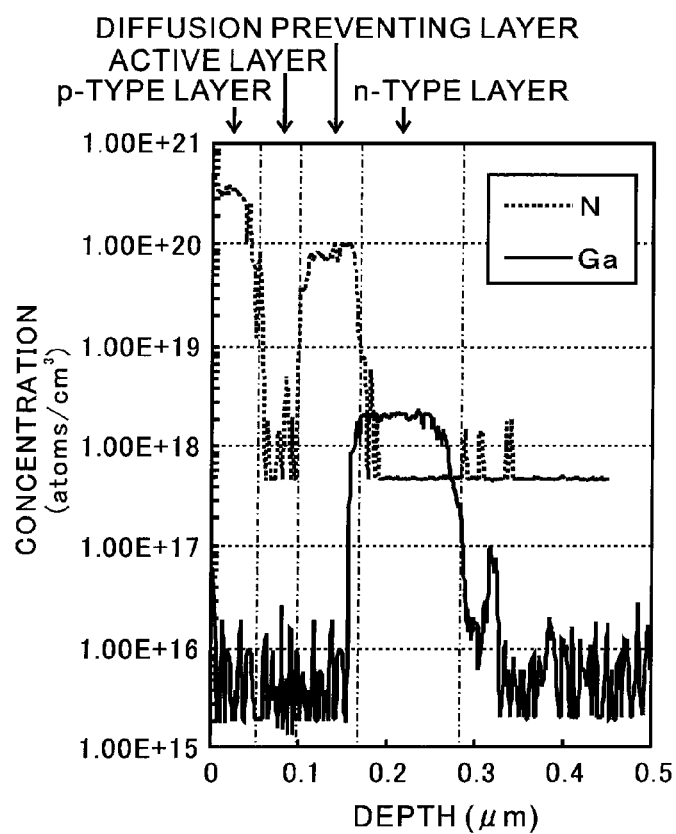
FIG. 3 is a graph showing depth profiles of N concentration and Ga concentration in a ZnO based LED device having a diffusion barrier layer.

FIG. 3 is a graph showing depth profiles of N concentration and Ga concentration in a ZnO based LED device having a diffusion barrier layer. This profile is a result of the measurement of the above-described sample 3. Moreover, this profile is based on a secondary ion-microprobe mass spectrometer (SIMS) analysis.

According to the profile, diffusion of the Ga doped to the n-type semiconductor layer to the active layer 4 and the p-type semiconductor layer 5 is prevented (restrained) by the diffusion barrier layer 9.

The SIMS analysis measured that the diffusion of Ga from the n-type semiconductor layer 3 to the diffusion barrier layer 9 was about 20 nm. That is, it is expected that the effect of the first embodiment can be obtained by making a layer thickness of the diffusion barrier layer 9 about 20 nm. However, a distance that the n-type dopants diffuse depends on the dopant concentration/quality inside the n-type semiconductor layer and crystalline quality and the N concentration of the diffusion barrier layer.

Figure 4:
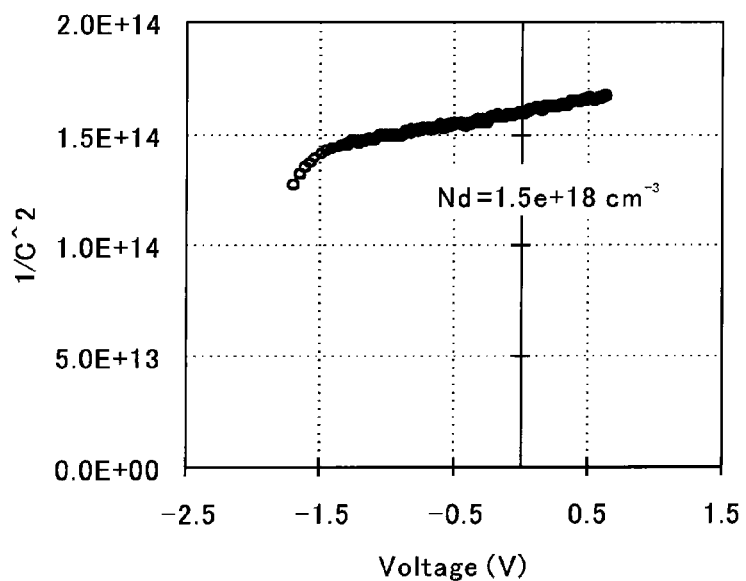
FIG. 4 is a graph showing a C-V measurement result of a single N-doped MgZnO film manufactured under the same condition as a diffusion barrier layer 9 of a sample 3 of a semiconductor light emitting device according to the first embodiment of the present invention.

FIG. 4 is a graph showing a C-V measurement result of a single N-doped MgZnO film manufactured under the same condition as a diffusion barrier layer 9 of a sample 3 of a semiconductor light emitting device according to the first embodiment of the present invention. The graph shows voltage on a horizontal axis and a value of 1/C2 on a vertical axis. A unit of C is represented by [nF/cm$^2$].

By calculating an n-type impurity density Nd from the slope of the graph, it was confirmed that the diffusion barrier layer 9 has the n-type impurity density Nd of $1.5 \times 10^{18}$ cm$^{-3}$.

Figure 5:
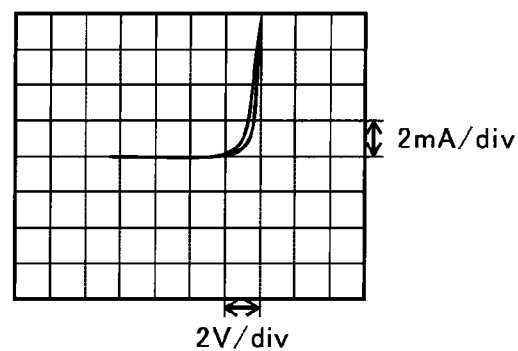
FIG. 5 is a graph showing current-voltage characteristics of the ZnO based LED (sample 3) having the diffusion barrier layer 9 according to the first embodiment of the present invention.

FIG. 5 is a graph showing current-voltage characteristics of the ZnO based LED (sample 3) having the diffusion barrier layer 9 according to the first embodiment of the present invention.

One unit of a vertical axis represents 2 mA, and one unit of a horizontal axis represents 2V in this measurement. A threshold voltage is 3.3V, and it is understood that the threshold voltage of the device according to the embodiment is increased comparing to the current voltage characteristics shown in FIG. 20 of the ZnO based LED fabricated by the conventional method. It can be considered that is because the diffusion barrier layer 9 prevents the Ga diffusion to the p-type semiconductor layer so that the conductivity of the p-type semiconductor layer is not deteriorated.

Figure 6:
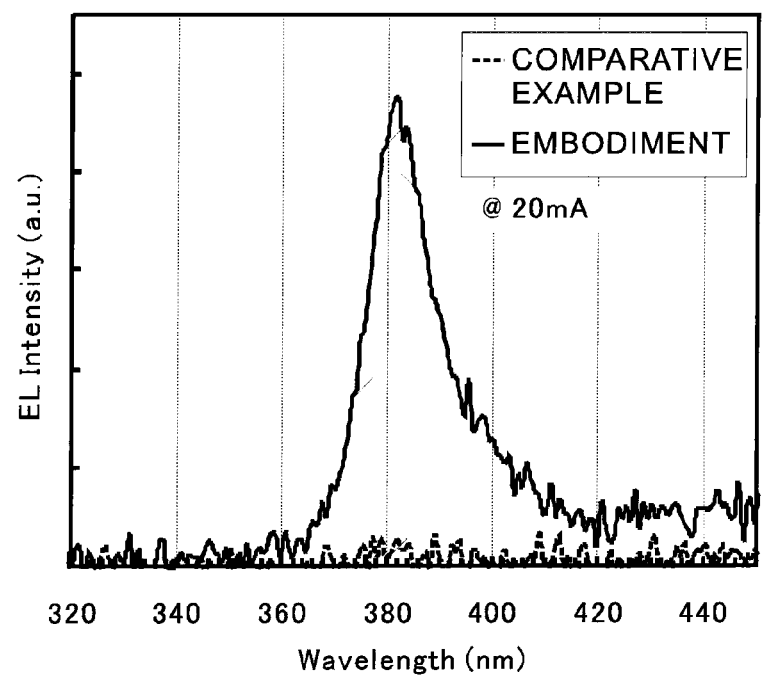
FIG. 6 is a graph showing EL spectra of the conventional ZnO based LED shown in FIG. 18 and the ZnO based LED (sample 3) having the diffusion barrier layer 9 according to the first embodiment of the present invention.
Figure 18:
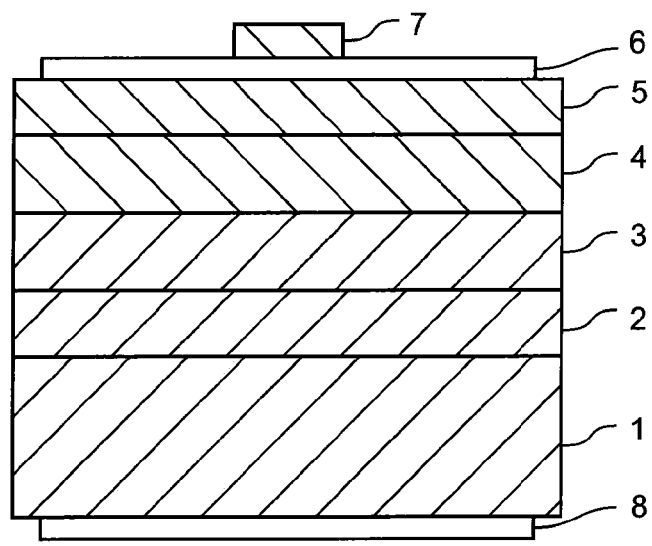
FIG. 18 is a cross sectional view showing one example of a structure of a ZnO based LED device manufactured by a conventional method.
Figure 19:
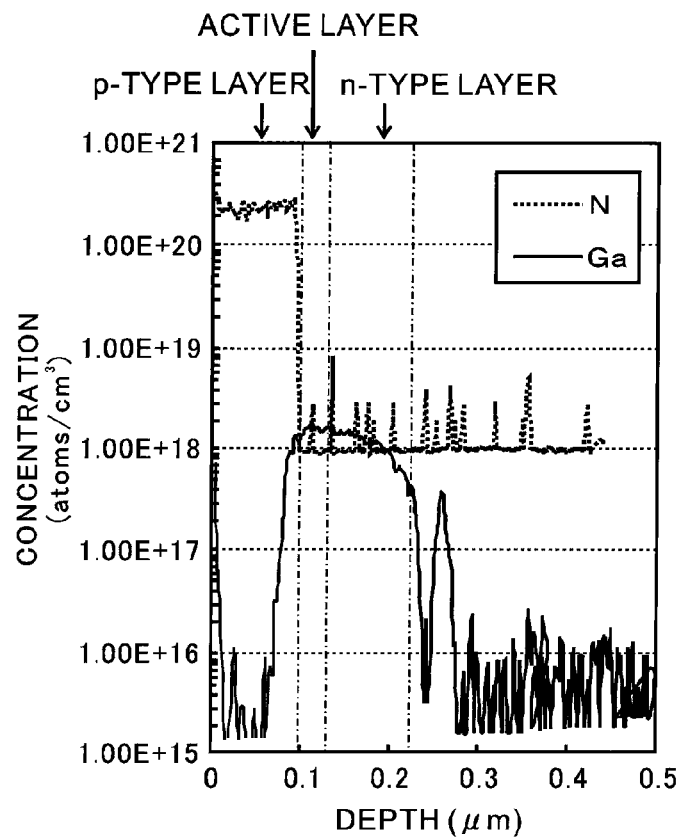
FIG. 19 is a graph showing depth profiles of N concentration and Ga concentration in the ZnO based LED manufactured by the conventional method as the LED shown in FIG. 18. This graph is based on a secondary ion-microprobe mass spectrometer (SIMS) measurement.

FIG. 6 is a graph showing EL spectra of the conventional ZnO based LED shown in FIG. 18 and the ZnO based LED (sample 3) having the diffusion barrier layer 9 according to the first embodiment of the present invention. The graph shows a wavelength on a horizontal axis and a luminous intensity on a vertical axis.

While the ZnO based LED fabricated by the conventional method did not emit light, a light emitting peak near 380 nm was observed in case of the ZnO based LED fabricated by the embodiment of the present invention. The light emission is considered to be luminescence near the band edge. It can be considered that the introduction of the diffusion barrier layer 9 in the ZnO based LED according to the embodiment makes the difference between the prior art and the present invention by preventing the deterioration of conductivity of the p-type semiconductor layer caused by the Ga diffusion.

As described in the above, according to the first embodiment of the present invention, the N-doped (Mg)ZnO:N layer as the diffusion barrier layer 9 is inserted between the ZnO based n-type layer 3 to which the n-type dopants are doped and the active layer 4 or the p-type layer 5; therefore, diffusion of the n-type dopants is stopped by the (Mg)ZnO:N layer 9 and the n-type dopants do not diffuse into the active layer 4 or the p-type layer 5.

Therefore, crystalline quality of the active layer is not deteriorated by the diffusion of the n-type dopants and so a semiconductor light emitting device that does not decrease internal quantum efficiency can be manufactured.

Moreover, it can be prevented that the diffusion of the n-type dopants deteriorates the conductivity of the p-type semiconductor layer.

Although Ga is used as the n-type dopants in the first embodiment, other group III elements such as Al, In, etc. can be used. Diffusion coefficient of Al atom is smaller than that of Ga atom; therefore, when Al is used as the dopants doped to the n-type semiconductor layer 3, the layer thickness of the diffusion barrier layer 9 can be thinner than the case using Ga as the dopants. On the other hand, diffusion coefficient of In atom is larger than that of Ga atom; therefore, when In is used as the dopants doped to the n-type semiconductor layer 3, the layer thickness of the diffusion barrier layer 9 should be thicker than the case using Ga as the dopants to restrain the diffusion of the n-type dopants.

Moreover, various group VII elements are effective for n-type dopants to a ZnO based semiconductor, and it can be considered that the diffusion barrier layer 9 according to the first embodiment can prevent the diffusion of the dopants from an n-type semiconductor layer using the group VII elements.

Furthermore, the first embodiment of the present invention can be adapted to a LED having various ZnO based multinary mixed crystal layers such as [Cd$_a$Zn$_{1-a}$O, Be$_a$Zn$_{1-a}$O, Ca$_a$Zn$_{1-a}$O (0<a<1 for both)], [ZnO$_{1-b}$S$_b$, ZnO$_{1-b}$Se$_b$, ZnO$_{1-b}$Te$_b$ (0<b<1 for both)], etc. other than Mg$_x$Zn$_{1-x}$O.

Next, a ZnO based light emitting diode (ZnO based LED) according to a second embodiment of the present invention will be explained. The inventors of the present invention have actually fabricated a ZnO based light emitting diode according to the second embodiment of the present invention and performed measurement of the current-voltage characteristics and confirmation of list emitting state. Moreover, measurements of the Ga concentration and N concentration in a depth direction were performed by using SIMS.

Figure 7:
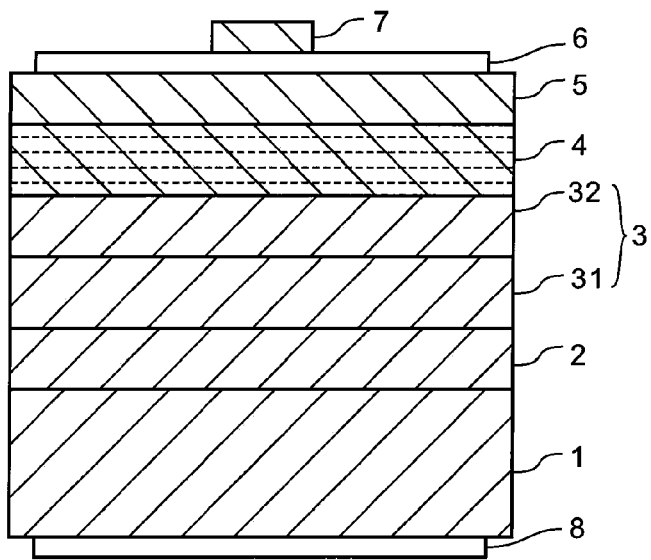
FIG. 7 is a schematic cross sectional view for explaining a method for manufacturing a ZnO based compound semiconductor device (ZnO based LED) and its structure according to a second embodiment of the present invention.

FIG. 7 is a schematic cross sectional view for explaining a method for manufacturing a ZnO based compound semiconductor device (ZnO based LED) and its structure according to a second embodiment of the present invention.

First, a thermal annealing process was performed to a ZnO substrate 1 and a surface of the substrate was cleaned. The thermal annealing process was performed in high vacuum of $1 \times 10^{-9}$ Torr at 900 degrees Celsius for 30 minutes.

Then, a ZnO buffer layer 2 with a thickness of about 10 nm was formed by irradiating the Zn beam and the O radical beam onto the ZnO substrate 1 by heating the substrate temperature at 350 degrees Celsius. Continuously 20 minutes annealing process was performed by rising the substrate temperature to 800 degree Celsius to improve a crystalline quality of the buffer layer 2.

Next, a Ga—N co-doped n-type ZnO layer 31 was grown on the ZnO buffer layer 2 by simultaneously irradiating the Zn beam, the O radical beam, the Ga beam and the N radical beam onto the substrate 1. For the irradiation of the Zn beam, 7N purity Zn was used as a solid state source, and the Zn beam flux intensity (JZn) was set to $2 \times 10^{15}$ atoms/(cm² s). The O radical beam was irradiated by introducing 6N purity oxygen gas into the electrodeless discharge tube at 2 sccm and generating plasma at 300 W high frequency power. The O radical amount (kOJO) was controlled to $1 \times 10^{15}$ atoms/(cm² s) by the amount of the oxygen gas flow and the high frequency power. For the irradiation of the Ga beam, 7N purity of Ga was used as a solid state source. The Ga beam flux intensity is controlled by a heating temperature of the Knudsen cell, and the temperature was set to 450 degrees Celsius. The N radical beam was irradiated by introducing 7N purity nitrogen gas into the electrodeless discharge tube at 0.5 sccm and generating plasma at 90 W high frequency power. The Ga concentration in the grown film was not less than $3 \times 10^{17}$ cm⁻³, and the N concentration in the grown film was not less than $1 \times 10^{20}$ cm⁻³. A film thickness of the Ga—N co-doped n-type ZnO layer 31 was 100 nm.

Thereafter, a Ga—N co-doped n-type $Mg_xZn_{1-x}O$ (x=0.25) layer (n-type cladding layer) 32 was grown on the Ga—N co-doped n-type ZnO layer 31 by simultaneously irradiating the Zn beam, the Mg beam, the O radical beam, the Ga beam and the N radical beam onto the substrate 1 at the substrate temperature of 900 degrees Celsius. For the irradiation of the Zn beam, 7N purity Zn was used as a solid state source, and the Zn beam flux intensity (JZn) was set to $2 \times 10^{15}$ atoms/(cm² s). For the irradiation of the Mg beam, 6N purity Mg was used as a solid state source, and the Mg beam flux intensity was set to $1.7 \times 10^{14}$ atoms/(cm² s). The O radical beam was irradiated by introducing 6N purity oxygen gas into the electrodeless discharge tube at 2 sccm and generating plasma at 300 W high frequency power. This condition corresponds to the O radical amount of $1 \times 10^{15}$ atoms/(cm² s). For the irradiation of the Ga beam, 7N purity of Ga was used as a solid state source. The Ga beam flux intensity is controlled by a heating temperature of the Knudsen cell, and the temperature was set to 450 degrees Celsius. The N radical beam was irradiated by introducing 7N purity nitrogen gas into the electrodeless discharge tube at 0.5 sccm and generating plasma at 90 W high frequency power. The Ga concentration in the grown film was not less than $3 \times 10^{17}$ cm⁻³, and the N concentration in the grown film was not less than $1 \times 10^{20}$ cm⁻³. A film thickness of the Ga—N co-doped n-type $Mg_xZn_{1-x}O$ (x=0.25) layer 32 was 30 nm.

In the second embodiment, a combination of the Ga—N co-doped n-type ZnO layer 31 and the Ga—N co-doped $Mg_xZn_{1-x}O$ (x=0.25) layer 32 is called the n-type layer 3.

Next, a ZnO active layer 4 was grown on the Ga—N co-doped n-type $Mg_xZn_{1-x}O$ (x=0.25) layer 32 by simultaneously irradiating the Zn beam and the O radical beam onto the substrate 1 at the substrate temperature of 900 degrees Celsius. For the irradiation of the Zn beam, 7N purity Zn was used as a solid state source, and the Zn beam flux intensity was set to $1.6 \times 10^{14}$ atoms/(cm² s). The O radical beam was irradiated by introducing 6N purity oxygen gas into the electrodeless discharge tube at 3 sccm and generating plasma at 300 W high frequency power. This condition corresponds to the O radical amount of $1.2 \times 10^{15}$ atoms/(cm² s). A thickness of the ZnO active layer 4 was 10 nm.

The active layer 4 has, for example, a double hetero (DH) structure or a multiple quantum well (MQW) structure. In case of having the DH structure, an undoped ZnO layer or a ZnO layer with proper conductivity is formed. In case of having MQW structure, the active layer 4 consists of a lamination of $(MgZnO/ZnO)_n/MgZnO$ thin films. In this case, the ZnO layer, etc. composes a well and the MgZnO layer composes a barrier.

Next, an N-doped p-type $Mg_xZn_{1-x}O$ (x=0.25) layer (p-type MgZnO layer) 5 was grown on the ZnO active layer 4 by simultaneously irradiating the Zn beam, the Mg beam, the O radical beam and the N radical beam onto the substrate 1 at the substrate temperature of 700 degrees Celsius. For the irradiation of the Zn beam, 7N purity Zn was used as a solid state source, and the Zn beam flux intensity (JZn) was set to $2 \times 10^{15}$ atoms/(cm² s).

For the irradiation of the Mg beam, 6N purity Mg was used as a solid state source, and the Mg beam flux intensity was set to $1.7 \times 10^{14}$ atoms/(cm² s). The O radical beam was irradiated by introducing 6N purity oxygen gas into the electrodeless discharge tube at 2 sccm and generating plasma at 300 W high frequency power. This condition corresponds to the O radical amount of $1 \times 10^{15}$ atoms/(cm² s). The N radical beam was irradiated by introducing 7N purity nitrogen gas into the electrodeless discharge tube at 0.5 sccm and generating plasma at 90 W high frequency power. A thickness of the p-type $Mg_xZn_{1-x}O$ (x=0.25) layer 5 was 30 nm. The N concentration in the grown film was not less than $1 \times 10^{20}$ cm⁻³.

As similar to the first embodiment, the p-type dopants doped into the p-type semiconductor layer 5 may be phosphorus (P) or arsenic (As), which are group V elements, instead of using nitrogen (N). Moreover, group I elements such as lithium (Li), sodium (Na), copper (Cu) and silver (Ag) can be used as the p-type dopants instead of the group V elements. Furthermore, a combination of the above atoms, for example N and P, can be co-doped.

Nitrogen atoms substitute a part of O-sites and become acceptors, and ionic radius of nitrogen is close to that of oxygen comparing to other group V elements and so stable substitution takes place. Various nitrogen sources such as $N_2$, $N_2O$, $NO$, $N_2+O_2$, $NH_3$, etc. containing nitrogen atoms can be used for doping nitrogen. Moreover, as similar to the first embodiment, the concentration of nitrogen (N) is preferably in a range of $1 \times 10^{18}$ cm⁻³ to $5 \times 10^{20}$ cm⁻³, and more preferably in a range of $1 \times 10^{19}$ cm⁻³ to $3 \times 10^{20}$ cm⁻³.

Finally, the electrodes were formed by the processes similar to the first embodiment. By the above processes, the ZnO base light emitting diode according to the second e FIG. 8 is a graph showing current-voltage characteristics of a conventional LED device.

Figure 8:
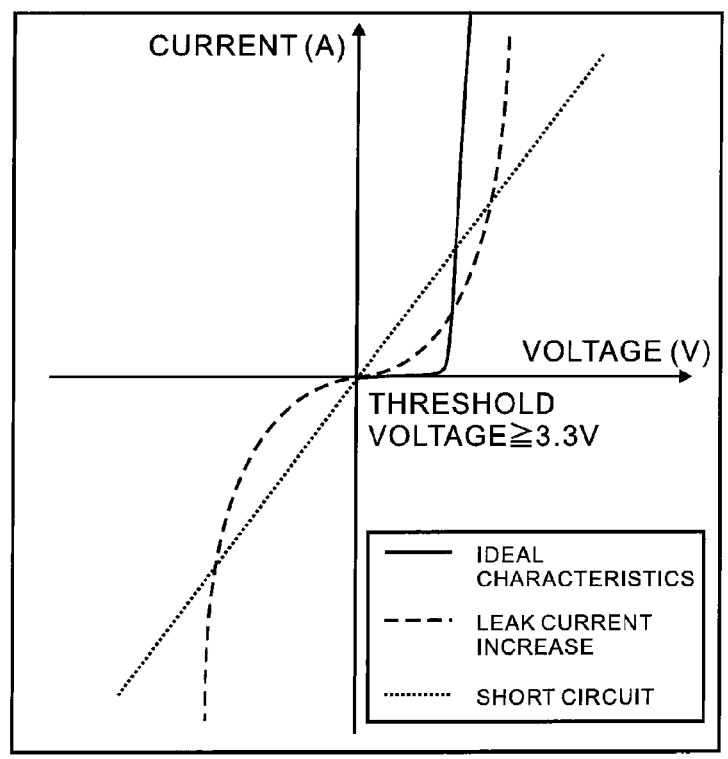
FIG. 8 is a graph showing current-voltage characteristics of a conventional LED device.

Generally a LED device has current-voltage characteristics shown in FIG. 8. Characteristics indicated by a sold line in FIG. 8 is ideal diode characteristics, wherein no leak current in forward bias characteristics and reverse bias characteristics and at least 3V of threshold voltage can be obtained. On the other hand, in characteristics indicated by a broken line, a withstand voltage is low in reverse bias characteristics and micro current begins to flow from a voltage lower than the threshold voltage in forward bias characteristics and so there is leak current.

Figure 9:
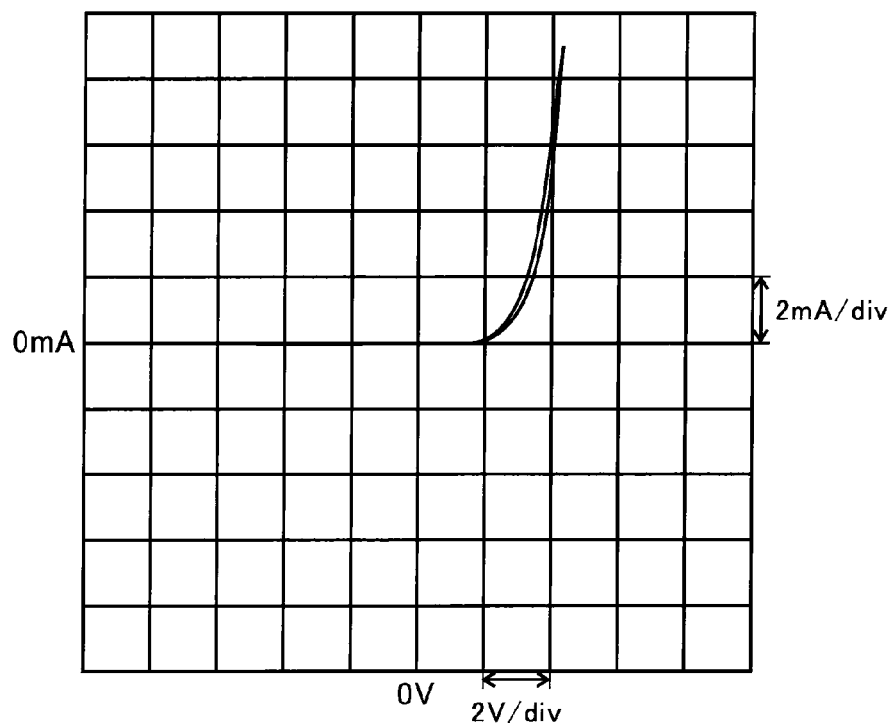
FIG. 9 is a graph showing current-voltage characteristics of the light emitting device manufactured by the method according to the second embodiment of the present invention.

FIG. 9 is a graph showing current-voltage characteristics of the light emitting device manufactured by the method according to the second embodiment of the present invention.

Figure 20:
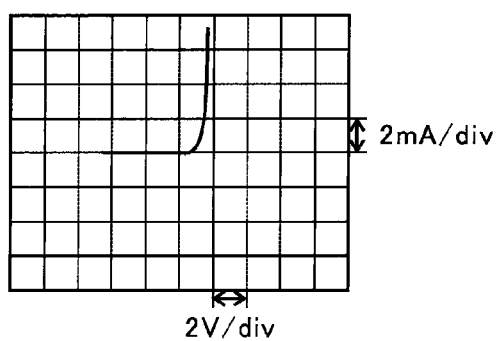
FIG. 20 is a graph showing one example of current-voltage characteristics of the ZnO based LED whose SIMS measurement is shown in FIG. 19.

As shown in FIG. 20, the light emitting diode (first comparative example) according to the prior art shows Schottky characteristics and has a low withstand voltage when the reverse voltage is applied. However, as shown in FIG. 9, this sample (the second embodiment) has the threshold voltage of not less than 3V with no leak current and has a high with stand voltage when the reverse voltage is applied.

Figure 10:
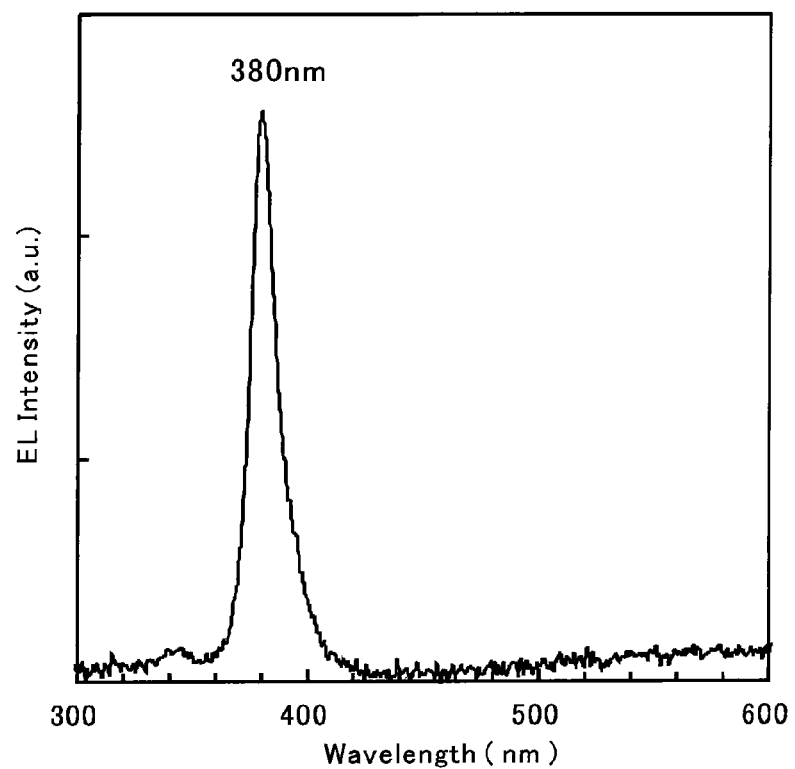
FIG. 10 is a graph showing a spectrum of the light emitting device manufactured by the method according to the second embodiment of the present invention.

FIG. 10 is a graph showing a spectrum of the light emitting device manufactured by the method according to the second embodiment of the present invention.

Regarding to the luminescence characteristic, different from the light emitting diode (first comparative example) according to the prior art shown in FIG. 18, the light emission at 380 nm could be obtained. It can be considered that this is an effect of restraining (preventing) the diffusion of Ga by co-doping nitrogen (N) to the Ga-doped layer. By the prevention of the diffusion of Ga, deterioration of the crystalline qualities of the active layer and the p-type layer can be restrained. Therefore, it can be considered that generation of defects causing nonradiative-recombination-centers in the active layer is restrained, and generation of n-type carriers in the p-type layer due to the generation of the defects can be restrained.

In the second embodiment nitrogen (N) is doped to both the n-type layer (n-ZnO layer 31 and the n-MgZnO layer 32) 3 and the p-type layer (p-MgZnO layer) 5; however, effects of the nitrogen (N) to conductivities are different from each other.

In the p-type layer 5, N atoms substitute a part of O sites to be acceptors and give the p-type conductivity to MgZnO. In this case, the growth temperature at the time of doping N is necessary to be 300 degrees Celsius≤Tg<800 degrees Celsius and preferably to be 500 degrees Celsius≤Tg≤700 degrees Celsius. If the growth temperature is too much higher than that temperature, the doped N atoms do not substitute the O sites or give the p-type conductivity. Moreover, if the growth temperature is too much lower than that temperature, a film will be grown three-dimensionally and have a rough surface. The three-dimensionally grown film does not show the p-type conductivity because donor defects such as transition, point defects, etc. are generated.

The growth temperature of the n-type layer 3 is necessary to be 800 degrees Celsius<Tg≤1100 degrees Celsius, and preferably to be 900 degrees Celsius≤Tg≤1100 degrees Celsius. N atoms doped at a temperature over 800 degrees Celsius become $N_2$ molecules in a film so that acceptors are not formed; therefore the film will not show the p-type conductivity.

Next, as a third embodiment, a buffer layer 2 was grown on a ZnO substrate 1, thereon a Ga—N co-doped n-type ZnO layer 31 with a thickness of 200 nm was grown and thereon an undoped ZnO layer 33 with a thickness of 200 nm was grown. Moreover, as a second comparative example, a Ga doped n-type ZnO layer with a thickness of 200 nm was grown on the buffer layer 2 instead of growing the Ga—N co-doped n-type ZnO layer 31. By performing SIMS analysis in a depth direction to these structures, it was confirmed whether or not gallium (Ga) diffused to the undoped ZnO layer 33 from the Ga—N co-doped n-type ZnO layer 31 and from the Ga doped n-type ZnO layer.

Figure 11:
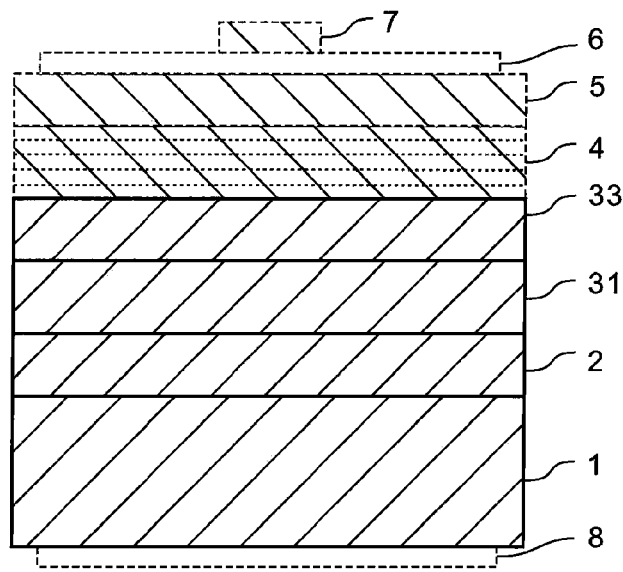
FIG. 11 is a schematic cross sectional view for explaining a method for manufacturing a sample of an n-type ZnO based compound semiconductor layer and its structure according to a third embodiment of the present invention.

FIG. 11 is a schematic cross sectional view for explaining a method for manufacturing a sample of an n-type ZnO based compound semiconductor layer and its structure according to a third embodiment of the present invention.

Those structures were fabricated by using the MBE method similar to the first and the second embodiments. First, a surface of the substrate 1 was cleaned and the ZnO buffer layer 2 was formed similar to the second embodiment.

Then, the Ga—N co-doped n-type ZnO layer 31 was grown on the ZnO buffer layer 2 by simultaneously irradiating the Zn beam, the O radical beam, the Ga beam and the N radical beam onto the substrate 1 at the substrate temperature of 900 degrees Celsius. For the irradiation of the Zn beam, 7N purity Zn was used as a solid state source, and the Zn beam flux intensity (JZn) was set to $2\times10^{15}$ atoms/(cm$^2$ s). The O radical beam was irradiated by introducing 6N purity oxygen gas into the electrodeless discharge tube at 2 sccm and generating plasma at 300 W high frequency power. The O radical amount (kOJO) was controlled to $1\times10^{15}$ atoms/(cm$^2$ s) by the amount of the oxygen gas flow and the high frequency power. For the irradiation of the Ga beam, 7N purity of Ga was used as a solid state source. The Ga beam flux intensity is controlled by a heating temperature of the Knudsen cell, and the temperature was set to 450 degrees Celsius. The N radical beam was irradiated by introducing 7N purity nitrogen gas into the electrodeless discharge tube at 0.5 sccm and generating plasma at 90 W high frequency power. The Ga concentration in the grown film was not less than $3\times10^{17}$ cm$^{-3}$, and the N concentration in the grown film was not less than $1\times10^{20}$ cm$^{-3}$. A film thickness of the Ga—N co-doped n-type ZnO layer 31 was 200 nm.

Thereafter, the undoped ZnO layer 33 with a thickness of 200 nm was grown on the Ga—N co-doped n-type ZnO layer 31 at the substrate temperature of 900 degrees Celsius. The undoped ZnO layer 33 was grown under the same growth condition as the Ga—N co-doped n-type ZnO layer 31 except the irradiations of the Ga beam and the N radical beam were stopped.

Moreover, as drawn by dotted lines in the drawing, by growing the active layer 4 and the p-type layer 5 and forming the p-type transparent electrode 6, the bonding electrode 7 and the n-type electrode 8 as same as the second embodiment, a ZnO based light emitting diode according to the third embodiment of the present invention can be fabricated.

In the second comparative example, the Ga—N co-doped n-type ZnO layer 31 according to the third embodiment was replaced by the Ga doped n-type ZnO layer with a film thickness of 200 nm. The Ga doped n-type ZnO layer was grown under the same growth condition as the Ga—N co-doped n-type ZnO layer 31 except the irradiation of the N radical beam was stopped.

Figure 12:
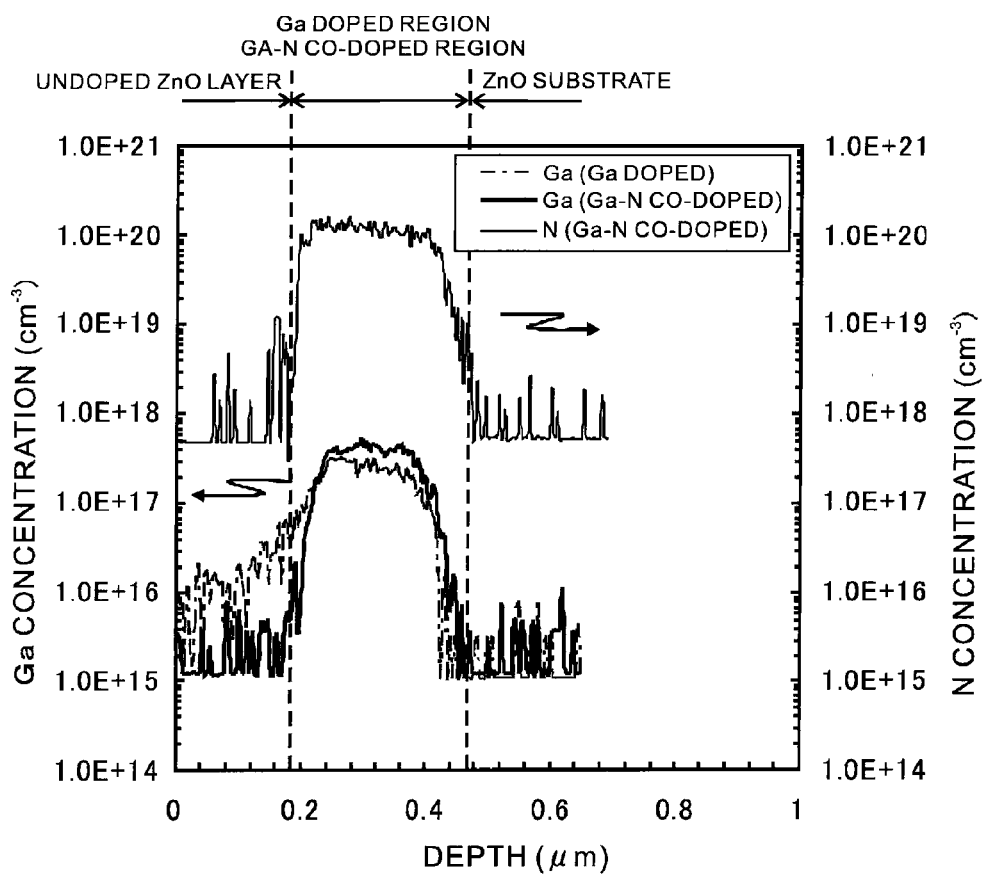
FIG. 12 is a graph showing a result of SIMS measurement of n-type ZnO based compound semiconductor layers according to the third embodiment of the present invention and a second comparative example.

FIG. 12 is a graph showing a result of SIMS measurement of n-type ZnO based compound semiconductor layers according to the third embodiment of the present invention and the second comparative example.

In the sample according to the second comparative example, the diffusion of Ga from the Ga doped n-type ZnO layer to the undoped ZnO layer thereon was confirmed. On the other hand, in the sample according to the third embodiment wherein nitrogen was co-doped to the Ga doped n-type ZnO layer, almost no Ga diffused to the undoped ZnO layer 33 and so it can be considered that the diffusion of Ga is prevented (restrained) by the co-doping of nitrogen (Ga—N co-doped n-type ZnO layer 31). It can be considered that is because Ga atoms are fixed by coupling of Ga atoms and N atoms.

Moreover, both the Ga concentration and the n-type carrier density of the sample which was grown up to the Ga doped n-type ZnO layer according to the second comparative example were $3\times10^{17}$(cm$^{-3}$). That is, an activation rate of Ga in the Ga doped n-type ZnO layer was almost "1".

Comparing to that, the Ga concentration of the sample which was grown up to the Ga—N co-doped ZnO layer 31 according to the third embodiment was $6\times10^{17}$(cm$^{-3}$) while the n-type carrier density of that was $5.5\times10^{17}$(cm$^{-3}$). Therefore, an activation ratio of the Ga in the Ga—N co-doped n-type ZnO layer 31 is not less than 0.9, and it can be considered that an effect of the co-doping of nitrogen on the Ga activation rate is very small.

Next, as sample of an n-type ZnO based compound semiconductor layer according to a third comparative example, buffer layer 2 was grown on a ZnO substrate 1, a high density Ga doped n-type ZnO layer was grown thereon with a thickness of 180 nm, a low density Ga doped n-type ZnO layer was grown thereon with a thickness of 120 nm, a high density Ga doped n-type ZnO layer was further grown thereon with a thickness of 120 nm, and a low density Ga doped n-type ZnO layer was further grown thereon with a thickness of 80 nm. In this structure it was confirmed whether or not the diffusion of Ga from the high density Ga doped n-type ZnO layer to the low density Ga doped n-type ZnO layer existed.

Figure 13:
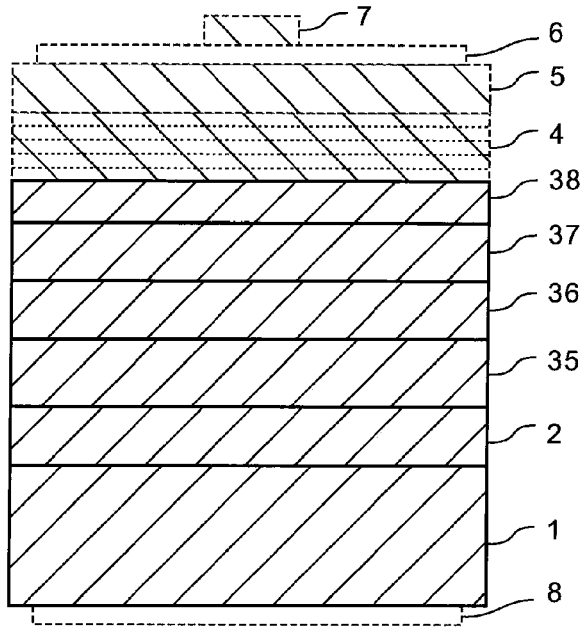
FIG. 13 is a schematic cross sectional view for explaining a method for manufacturing a sample of an n-type ZnO based compound semiconductor layer and its structure according to a fourth embodiment of the present invention.

FIG. 13 is a schematic cross sectional view for explaining a method for manufacturing a sample of an n-type ZnO based compound semiconductor layer and its structure according to a fourth embodiment of the present invention.

A sample of an n-type ZnO based compound semiconductor layer according to the fourth embodiment was fabricated by replacing all the Ga doped n-type ZnO layers in the third comparative example with Ga—N co-doped layers. In this structure, it was confirmed whether or not Ga atoms diffuse from the Ga high density Ga doped n-type ZnO layer to the low density Ga doped n-type ZnO layer.

Those structures were fabricated by using the MBE method similar to the first to the third embodiments. First, a surface of the substrate 1 was cleaned and the ZnO buffer layer 2 was formed similar to the second embodiment.

Then, the high density Ga—N co-doped n-type ZnO layer 35 was grown on the ZnO buffer layer 2 by simultaneously irradiating the Zn beam, the O radical beam, the Ga beam and the N radical beam onto the substrate 1 at the substrate temperature of 900 degrees Celsius. For the irradiation of the Zn beam, 7N purity Zn was used as a solid state source, and the Zn beam flux intensity (JZn) was set to $2\times10^{15}$ atoms/(cm$^2$ s). The O radical beam was irradiated by introducing 6N purity oxygen gas into the electrodeless discharge tube at 2 sccm and generating plasma at 300 W high frequency power. The O radical amount (kOJO) was controlled to $1\times10^{15}$ atoms/(cm$^2$ s) by the amount of the oxygen gas flow and the high frequency power.

For the irradiation of the Ga beam, 7N purity of Ga was used as a solid state source. The Ga beam flux intensity is controlled by a heating temperature of the Knudsen cell, and the temperature was set to 470 degrees Celsius. The N radical beam was irradiated by introducing 7N purity nitrogen gas into the electrodeless discharge tube at 0.5 sccm and generating plasma at 90 W high frequency power. The Ga concentration in the grown film was not less than $3\times10^{18}$ cm$^{-3}$, and the N concentration in the grown film was not less than $1\times10^{20}$ cm$^{-3}$. A film thickness of high density Ga—N co-doped n-type ZnO layer 35 was 180 nm.

Next, a low density Ga—N co-doped n-type ZnO layer 36 with a thickness of 120 nm was grown on the high density Ga—N co-doped n-type ZnO layer 35. The growth condition was similar to that of the high density Ga—N co-doped n-type ZnO layer 35 except setting the temperature of the Knudsen cell for Ga to 450 degrees Celsius. The Ga concentration in the grown film was not less than $3\times10^{17}$ cm$^{-3}$.

Then, a high density Ga—N co-doped n-type ZnO layer 37 with a thickness of 120 nm was further grown on the low density Ga—N co-doped n-type ZnO layer 36 under the similar growth condition as the high density Ga—N co-doped n-type ZnO layer 35.

Thereafter, a low density Ga—N co-doped n-type ZnO layer 38 with a thickness of 80 nm was further grown on the high density Ga—N co-doped n-type ZnO layer 37 under the similar growth condition as the low density Ga—N co-doped n-type ZnO layer 36.

Moreover, as drawn by dotted lines in the drawing, by growing the active layer 4 and the p-type layer 5 and forming the p-type transparent electrode 6, the bonding electrode 7 and the n-type electrode 8 as same as the second embodiment, a ZnO based light emitting diode according to the fourth embodiment of the present invention can be fabricated.

In the third comparative example, the Ga—N co-doped n-type ZnO layers 35 to 38 according to the fourth embodiment were replaced with Ga doped n-type ZnO layers. The Ga doped n-type ZnO layers were grown under the similar growth condition as the Ga—N co-doped n-type ZnO layers 35 to 38 according to the fourth embodiment except stopping the irradiation of the N radical beam.

By performing SIMS analysis in a depth direction to the sample according to the fourth embodiment and the third comparative example, it was confirmed whether or not gallium (Ga) diffused to a low density Ga doped n-type ZnO layer from a high density Ga doped n-type ZnO layer.

Figure 14:
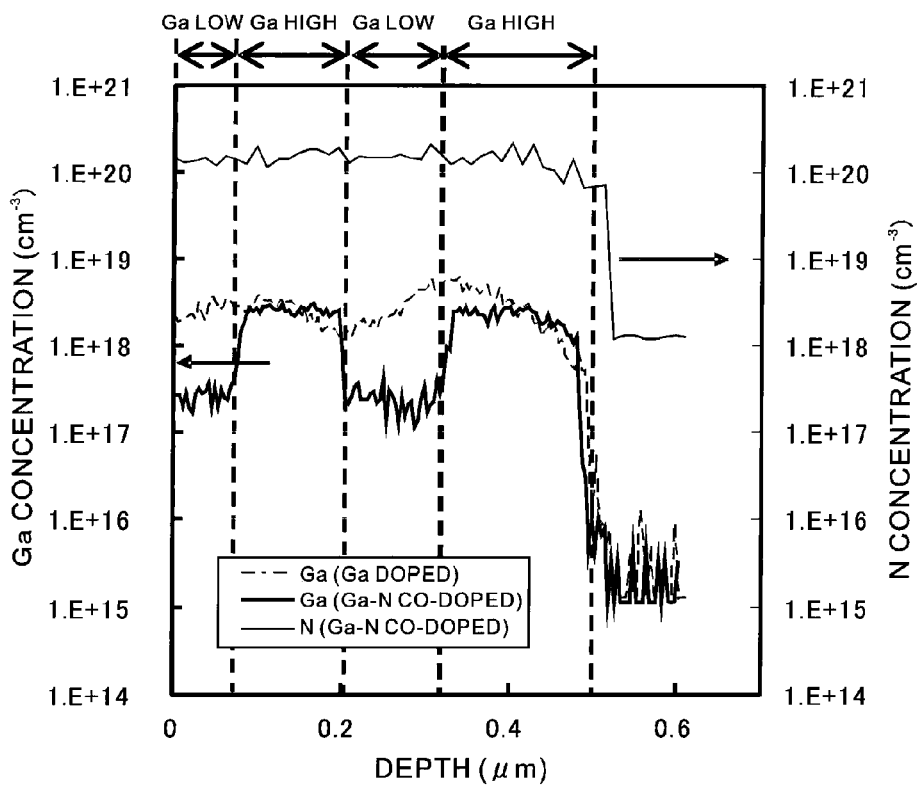
FIG. 14 is a graph showing a result of SIMS measurement of the n-type ZnO based compound semiconductor layers according to the fourth embodiment of the present invention and a third comparative example.

FIG. 14 is a graph showing a result of SIMS measurement of the n-type ZnO based compound semiconductor layers according to the fourth embodiment of the present invention and the third comparative example.

A dotted line indicates the Ga concentration of the third comparative example, and a bold line indicates the Ga concentration of the fourth embodiment. Moreover, a sold line indicates the N concentration of the fourth embodiment. In the sample to which only Ga was doped and concentration of Ga was made to be varied according to the third comparative example, it can be understood that Ga diffused and its concentration distribution was averaged. On the other hand, in the sample to which N was co-doped according to the fourth embodiment, the concentration distribution of Ga was maintained without being averaged. It is considered that is an effect of the N co-doping.

As shown in FIG. 18, in the sample (first comparative example) of the semiconductor light emitting device according to the prior art, Ga atoms slightly diffuses to the p-type layer 5 although nitrogen (N) is doped as shown in FIG. 20. It may be because the p-type layer 5 is grown at 700 degrees Celsius and so crystalline quality is low and Ga diffuses via the defects formed in the growth process. Therefore, it is preferable that a layer itself is a film having small defects in order to restrain the diffusion of Ga in the Ga—N co-doped ZnO based semiconductor layer. In concrete, the number of pits is necessary to be small.

Figure 15A:
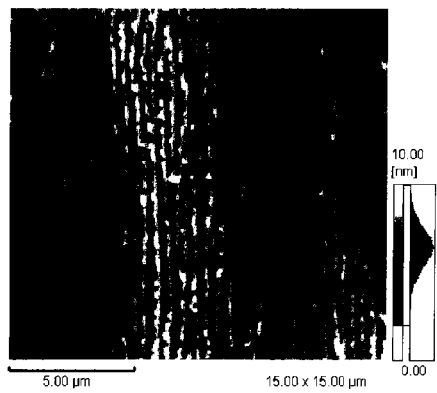
FIG. 15A are photographs illustrating a result of atomic force microscopy (AFM) observation of an N doped ZnO layer grown on a ZnO substrate at a substrate temperature of 700 degrees Celsius.
Figure 15A:
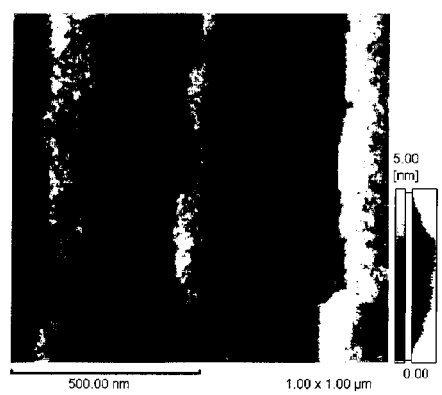
Figure 15B:
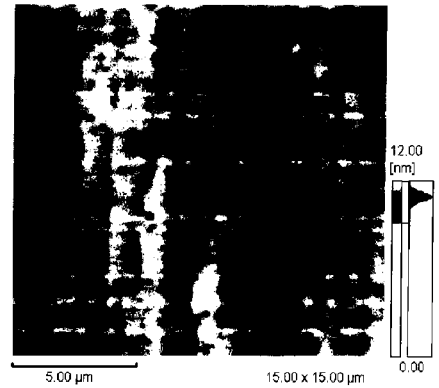
FIG. 15B are photographs illustrating a result of atomic force microscopy (AFM) observation of a Ga—N co-doped ZnO layer grown on a ZnO substrate at a substrate temperature of 900 degrees Celsius.
Figure 15B:
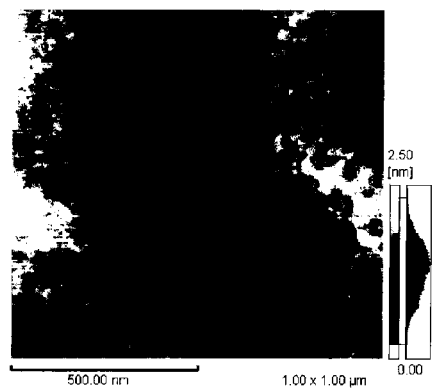

FIG. 15A and FIG. 15B are photographs illustrating results of observations of ZnO layers by an atomic force microscopy (AFM). In each drawing a photograph on a top measures 15 μm on each side, and a photograph on a bottom measures fpm on each side. The N doped ZnO layer was grown under the same condition as the p-type MgZnO layer 5 of the sample according to the third embodiment. Moreover, the Ga—N co-doped ZnO layer was grown under the same condition as the Ga—N co-doped MgZnO layer 32 of the sample according to the third embodiment.

FIG. 15A are photographs illustrating a result of atomic force microscopy (AFM) observation of an N doped ZnO layer grown on a ZnO substrate at a substrate temperature of 700 degrees Celsius.

Innumerable (about $3\times10^7/cm^2$) small pits can be seen. This is because the growth temperature was 700 degrees Celsius. Under this condition, the diffusion of Ga is likely to occur via the pits even if N is doped.

FIG. 15B are photographs illustrating a result of atomic force microscopy (AFM) observation of a Ga—N co-doped ZnO layer grown on a ZnO substrate at a substrate temperature of 900 degrees Celsius.

The very small number (less than $4\times10^4/cm^2$) of pits can be seen. This is because the growth temperature was 900 degrees Celsius. Ga atoms are fixed and the diffusion is restrained in such Ga—N co-doped ZnO based film.

As described in the above, according to the second to fourth embodiments of the present invention, nitrogen (N) is co-doped with gallium (Ga) when growing the Ga doped n-type ZnO based semiconductor layer and so the diffusion of Ga to other layers can be prevented (restrained). As a result, deterioration of crystalline qualities of other layers by the Ga diffusion can be restrained.

Moreover, generation of defects causing nonradiative-recombination-centers in the active layer is restrained, and generation of n-type carriers in the p-type layer due to the generation of the defects can be restrained.

Furthermore, the threshold voltage is at least higher than the band gap (about 3.3V) of ZnO in the light emitting device and the internal quantum efficiency is improved.

Further, a surface planarity of the Ga doped layer is improved. The n-type dopants, for example, $1\times10^{17}$ to $1\times10^{19}$ cm$^{-3}$ of Ga atoms are doped to the n-type ZnO based semiconductor layer of the ZnO based semiconductor light emitting device. If the Ga concentration exceeds $1\times10^{18}$ cm$^{-3}$, a surface of the grown film will be very rough and be grown three-dimensionally. If the n-type ZnO based semiconductor layer is grown three-dimensionally, the active layer or the p-type layer formed thereon will be also grown three-dimensionally. A three-dimensionally grown film with a rough surface has many transitions and spot defects, and it is not preferable in terms of the internal quantum efficiency and shortens a life time of the device. However, by doping nitrogen (N) to the Ga doped n-type ZnO based semiconductor layer as the co-dopants, the three-dimensional growth is restrained and so the n-type ZnO based semiconductor layer having a good surface planarity can be obtained. It is considered that is because the surfactant effect along with the mixture of nitrogen into a film works.

As one of recently prospected methods, the surfactant mediated epitaxy is known. This is a method for artificially change a growing style of a thin film by using a surface active agent called surfactant (atoms or molecules), and the method is effective means for controlling epitaxial growth. For example, Japanese Laid-open Patent No. 2004-221352 discloses a technique using hydrogen as the surfactant.

According to the embodiments of the present invention, the distribution of the Ga concentration deliberately formed in the n-type ZnO semiconductor layer can be maintained by the co-doping of N without being averaged by the diffusion.

Methods for giving a continuous or a step-like gradient to the carrier concentration in a film thickness direction in an n-type semiconductor layer composing a light emitting diode are disclosed in Japanese Patent No. 2663814 and Japanese Laid-open Patent No. 2004-95649, the entire contents of which are incorporated herein by reference. They suggest that a light emission luminance of the light emitting diode will be greatly improved by that.

Especially, Japanese Laid-open Patent No. 2004-95649 discloses a technique for giving a gradient in an n-type carrier concentration in an n-type semiconductor layer composing a light emitting diode. In a concrete example, it is disclosed that the gradient is given to make the n-type carrier concentration decreased from a side near an active layer to a side far from the active layer.

By that, sufficient current spreading can be obtained even if the carrier concentration of whole ZnO based semiconductor layer is low. Moreover, a total amount of the doping can be decreased and the crystalline quality is not deteriorated; therefore, the ZnO based semiconductor layer of good crystalline quality can be formed. As a result, a reliable light emitting device with a high internal quantum efficiency can be realized.

This method for giving the gradient in the n-type carrier concentration in the n-type ZnO based semiconductor layer has a unique effect in case of forming a light emitting device structure on an insulating substrate (e.g., a sapphire substrate).

Figure 16:
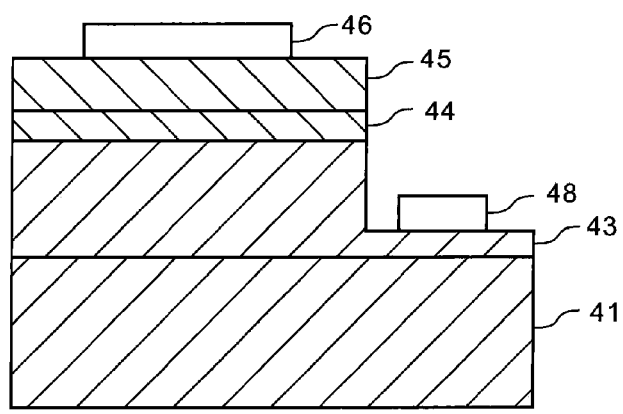
FIG. 16 is a schematic cross sectional view showing one example of a light emitting device structure formed on an insulating substrate.

FIG. 16 is a schematic cross sectional view showing one example of a light emitting device structure formed on an insulating substrate.

In case of forming a light emitting device structure on an insulating substrate 41 (e.g., a sapphire substrate), it is necessary to form an n-type electrode 48 and a p-type electrode 46 on the same plane. There is a part where current flows in a direction parallel to a film surface of the semiconductor.

When such structure is applied to a ZnO based compound semiconductor device, the specific electrical resistance of the n-type layer 43 becomes large and current spreading becomes insufficient. Therefore, current flows mainly in the minimum distance and concentrates on an edge of a mesa structure near the n-type electrode 48, and so it causes a problem that only the outer circumference of the mesa structure emits light.

Figure 17:
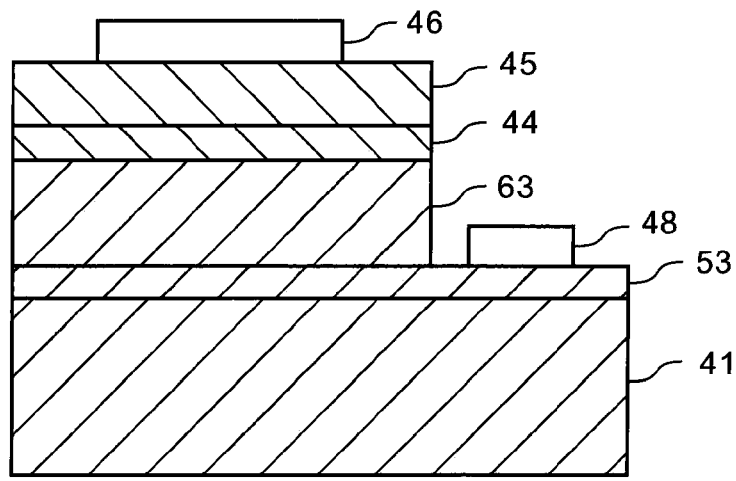
FIG. 17 is a schematic cross sectional view showing one example of a semiconductor light emitting device having an n-type semiconductor layer keeping desired distribution of impurity concentrations by nitrogen (N) co-doping according to the embodiment of the present invention.

FIG. 17 is a schematic cross sectional view showing one example of a semiconductor light emitting device having an n-type semiconductor layer keeping desired distribution of impurity concentrations by nitrogen (N) co-doping according to the embodiment of the present invention.

As shown in the drawing, an n-type ZnO based semiconductor layer 53 with a high carrier concentration having a part contacted with an n-type electrode 48 is formed with a thickness not deteriorating a crystalline quality and as a part where current follows in a direction perpendicular to a lamination direction of the semiconductor, and an n-type layer 63 of a good crystalline quality with low carrier concentration is formed thereon to obtain a surface light emitting device without current concentration.

It is necessary for giving a gradient in the n-type carrier concentration to give a gradient in the concentration of the n-type impurity such as Ga, Al, In, etc. In a concrete example, a gradient of the n-type impurity concentration is made to be continuous. By that, generation of cracks or other defects can be restrained because there is no steep change in the crystal growth. Therefore, a reliable light emitting device with a high internal quantum efficiency can be realized.

In order to give a step-like gradient in the n-type carrier concentration, a plurality of single layers having different n-type impurity concentrations can be laminated. By that, even in a method wherein a continuous change in the impurity concentrations is difficult such as a laser abrasion method or the likes, steep change in the crystal growth can be restrained and generation of cracks or other defects can be restrained. Therefore, a reliable light emitting device with a high internal quantum efficiency can be realized.

As the distribution of n-type impurity concentration in the n-type ZnO based semiconductor layer, it is preferable to make the concentration in a range of $1\times10^{18}(cm^{-3})$ to $1\times10^{20}$ $(cm^{-3})$ in a region far from the active layer and in a range of $1\times10^{17}(cm^{-3})$ to $1\times10^{19}(cm^{-3})$ in a region near the active layer. Moreover, it is more preferable to make the concentration about $1\times10^{19}(cm^{-3})$ in the region far from the active layer and about $1\times10^{18}(cm^{-3})$ in the region near the active layer. The n-type impurity concentration in the n-type ZnO based semiconductor layer gets smaller as it gets closer to the active layer.

However, in reality, it is very difficult to maintain the desired doping concentration distribution (carrier concentration distribution) just by controlling the amount of the n-type impurities because the n-type impurities in the n-type ZnO based semiconductor layer are averaged by the diffusion after growing other layers (e.g., the active layer, the p-type ZnO based semiconductor layer, etc.).

In order to solve the problem, nitrogen atoms are co-doped with the n-type impurity such as Ga, etc. according to the embodiments. By that the diffusion of the n-type impurities are restrained (prevented) and the n-type semiconductor layer with the desired distribution of the impurity concentration can be obtained.

Moreover, in the Ga—N co-doped layer according to the embodiments of the present invention, the N concentration at least similar to the Ga concentration is necessary. The Ga concentration in the n-type layer is $1\times10^{17}$ to $1\times10^{19}$ cm$^{-3}$. If the G concentration is less than $1\times10^{17}$, the n-type carrier density is too small as an n-type layer of the semiconductor light emitting device. Moreover, if the Ga concentration is more than $1\times10^{19}$ cm$^{-3}$, the n-type layer grows three-dimensionally and its crystalline quality becomes drastically lowered.

Therefore, the N concentration at least similar to the Ga concentration is necessary for co-doping. Moreover, the N concentration can be higher than the Ga concentration. The N concentration can be increased up to about $5\times10^{20}$ cm$^{-3}$ without deterioration of the crystalline quality or carrier concentration. In terms of restraining the Ga diffusion and obtaining a film with a good surface planarity, the N concentration is preferably about $3\times10^{20}$ cm$^{-3}$. If the N concentration is higher than that, the crystalline quality of the n-type layer will be drastically deteriorated.

Although Ga elements have been explained as elements which diffuse into the other layers form the n-type ZnO based semiconductor layer in the above-described embodiments, the embodiments are not limited to that. Aluminum (Al) and indium (In) can be named as the group II elements which are used as n-type dopants in a ZnO based semiconductor and they are known as the elements which diffuse into ZnO. The N co-doping according to the second to the fourth embodiments can restrain the diffusion of Al and In.

Further, various ZnO based multinary mixed crystal layers such as [$Mg_aZn_{1-a}O$, $Cd_aZn_{1-a}O$, $Be_aZn_{1-a}O$, $Ca_aZn_{1-a}O$ (0<a<1)], [$ZnO_{1-b}S_b$, $ZnO_{1-b}Se_b$, $ZnO_{1-b}Te_b$ (0<b<1)], etc. can be used for the Ga—N co-doped n-type ZnO based semiconductor layer according to the second to fourth embodiments other than ZnO. In this case, one or a combination of a Cd source gun, a Be source gun, a Ca source gun, a S source gun, a Se source gun and a Te source gun, etc. is added to the apparatus for manufacturing a ZnO based compound semiconductor shown in FIG. 1.

The embodiments of the present invention can be adapted to short-wavelength (ultraviolet to blue) light emitting diode (LED), short-wavelength laser diode (LD), and their related products such as various indicators, LED displays, etc.

Moreover, the embodiments of the present invention can be adapted to a white LED and its related products such as lighting devices, various indicators, various displays, back lights of displays, etc. Furthermore, the embodiments of the present invention can be adapted to a ZnO based electrode (e.g., a transparent conductive film) and its related products, various electronic devices such as a ZnO based transistor, etc. and the related products and a ZnO based sensor (e.g., thermo sensor, UV sensor, etc.) and the related products.

Moreover, the embodiments of the present invention can be adapted not only to ZnO based compound semiconductor light emitting devices but also to various ZnO based compound semiconductor devices and its related product including a transistor, a transparent conductive film, a piezoelectric element, a thermoelectric element, a UV sensor, etc.

Furthermore, the layers to which the group III elements such as Ga elements, etc. are diffused are not limited to the p-type semiconductor layer 5 and the active layer 4 but may be other layers, for example, an undoped ZnO layer when the embodiments are adapted to a high electron mobility transistor (HEMT).

The present invention has been described in connection with the preferred embodiments. The invention is not limited only to the above embodiments. It is apparent that various modifications, improvements, combinations, and the like can be made by those skilled in the art.

What are claimed are:

1. A ZnO based compound semiconductor device, comprising:
    an n-type semiconductor layer, comprising a single layer to which both group III elements and nitrogen (N) atoms are doped;
    a p-type semiconductor layer formed above the n-type semiconductor layer; and
    an active layer formed between the n-type semiconductor layer and the p-type semiconductor layer;
    wherein a concentration of nitrogen (N) doped to the n-type semiconductor layer is not less than a concentration of the group III elements and not more than $3\times10^{20}$ cm$^{-3}$.

2. The ZnO based compound semiconductor device according to claim 1, wherein the n-type semiconductor layer, the active layer and the p-type semiconductor layer are laminated on a substrate selected from a zinc oxide substrate (ZnO), a sapphire substrate ($Al_2O_3$), a silicon carbide substrate (SiC), a gallium nitride substrate (GaN), a $Mg_xZn_{1-x}O$ substrate where 0≤x<1, and a Si substrate.

3. The ZnO based compound semiconductor device according to claim 1, wherein a concentration of the group III elements doped to the n-type semiconductor layer is distributed in a film thickness direction.

4. The ZnO based compound semiconductor device according to claim 3, wherein the concentration of the group III elements doped to the n-type semiconductor layer changes continuously.

5. The ZnO based compound semiconductor device according to claim 3, wherein the concentration of the group III elements doped to the n-type semiconductor layer changes in a step-like form.

6. The ZnO based compound semiconductor device according to claim 3, wherein the concentration of the group III elements doped to the n-type semiconductor layer decreases with increasing proximity to the active layer.

7. The ZnO based compound semiconductor device according to claim 6, wherein the concentration of the group III elements doped to the n-type semiconductor layer is $1\times10^{18}$ (cm$^{-3}$) to $1\times10^{20}$ (cm$^{-3}$) in a first region and $1\times10^{17}$ (cm$^{-3}$) to $1\times10^{19}$ (cm$^{-3}$) in a second region, the first region being farther from the active layer than the second region.

8. A method for manufacturing a ZnO based semiconductor device, comprising:
   preparing a substrate;
   forming an n-type semiconductor layer, comprising a single layer to which both group III elements and nitrogen (N) atoms are doped, on the substrate by using a molecule beam epitaxy (MBE) method;
   forming an active layer on the n-type semiconductor layer by using the MBE method; and
   forming a p-type semiconductor layer on the active layer by using the MBE method;
   wherein a concentration of nitrogen (N) doped to the n-type semiconductor layer is not less than a concentration of the group III elements and not more than $3\times10^{20}$ cm$^{-3}$.

9. The method according to claim 8, wherein in the forming of the n-type semiconductor layer, the nitrogen (N) atoms are doped at a growth temperature of more than 800 degrees Celsius.

10. The method according to claim 8, wherein in the forming of the p-type semiconductor layer, nitrogen (N) atoms are doped at a growth temperature of less than 800 degrees Celsius.

* * * * *